United States Patent
Kankani et al.

(10) Patent No.: US 9,244,763 B1
(45) Date of Patent: Jan. 26, 2016

(54) SYSTEM AND METHOD FOR UPDATING A READING THRESHOLD VOLTAGE BASED ON SYMBOL TRANSITION INFORMATION

(71) Applicant: SanDisk Enterprise IP LLC, Milpitas, CA (US)

(72) Inventors: Navneeth Kankani, Fremont, CA (US); Charles See Yeung Kwong, Redwood City, CA (US)

(73) Assignee: SANDISK ENTERPRISE IP LLC, Milpitas, CA (US)

( * ) Notice: Subject to any disclaimer, the term of this patent is extended or adjusted under 35 U.S.C. 154(b) by 173 days.

(21) Appl. No.: 14/029,694

(22) Filed: Sep. 17, 2013

Related U.S. Application Data

(60) Provisional application No. 61/800,034, filed on Mar. 15, 2013.

(51) Int. Cl.
G06F 12/00 (2006.01)
G06F 11/00 (2006.01)
G06F 11/10 (2006.01)

(52) U.S. Cl.
CPC .................................. G06F 11/1008 (2013.01)

(58) Field of Classification Search
CPC .... G11C 11/5642; G11C 16/26; G11C 29/00; G11C 16/3404; G11C 11/56; G11C 16/00; G11C 16/3495; G11C 2216/22; G06F 11/1068; G06F 12/0246; G06F 11/1016; G06F 11/1441; G06F 2212/7211; G06F 3/0658; Y02B 60/1225
USPC ............ 714/E11.034, 763, 764, 42, 746, 768; 711/E12.008, E12.001; 365/185.22, 365/185.33, 210.12
See application file for complete search history.

(56) References Cited

U.S. PATENT DOCUMENTS

| 4,173,737 A | 11/1979 | Skerlos et al. |
|---|---|---|
| 4,888,750 A | 12/1989 | Kryder et al. |

(Continued)

FOREIGN PATENT DOCUMENTS

| EP | 1 299 800 | 4/2003 |
|---|---|---|
| EP | 1465203 A1 | 10/2004 |

(Continued)

OTHER PUBLICATIONS

Ashkenazi et al., "Platform independent overall security architecture in multi-processor system-on-chip integrated circuits for use in mobile phones and handheld devices," ScienceDirect, Computers and Electrical Engineering 33 (2007), 18 pages.

(Continued)

*Primary Examiner* — Phung M Chung
(74) *Attorney, Agent, or Firm* — Morgan, Lewis & Bockius LLP

(57) ABSTRACT

The various implementations described herein include systems, methods and/or devices that may enhance the reliability with which data can be stored in and read from a memory. The method includes obtaining symbol transition information corresponding to symbol read errors identified while reading data from flash memory cells in a flash memory device. The method further includes determining a reading threshold voltage offset, based at least in part on: a plurality of probability values determined from the symbol transition information; a current count of program-erase cycles; and a word line zone value for a word line zone containing the flash memory cells. Additionally, the method includes generating an updated reading threshold voltage in accordance with the reading threshold voltage offset and the current value of the reading threshold voltage.

22 Claims, 11 Drawing Sheets

(56) References Cited

U.S. PATENT DOCUMENTS

| | | | |
|---|---|---|---|
| 4,916,652 A | 4/1990 | Schwarz et al. | |
| 5,129,089 A | 7/1992 | Nielsen | |
| 5,270,979 A | 12/1993 | Harari et al. | |
| 5,329,491 A | 7/1994 | Brown et al. | |
| 5,381,528 A | 1/1995 | Brunelle | |
| 5,519,847 A | 5/1996 | Fandrich et al. | |
| 5,530,705 A | 6/1996 | Malone, Sr. | |
| 5,537,555 A | 7/1996 | Landry et al. | |
| 5,551,003 A | 8/1996 | Mattson et al. | |
| 5,636,342 A | 6/1997 | Jeffries | |
| 5,657,332 A | 8/1997 | Auclair et al. | |
| 5,666,114 A | 9/1997 | Brodie et al. | |
| 5,708,849 A | 1/1998 | Coke et al. | |
| 5,765,185 A | 6/1998 | Lambrache et al. | |
| 5,890,193 A | 3/1999 | Chevallier | |
| 5,936,884 A | 8/1999 | Hasbun et al. | |
| 5,943,692 A | 8/1999 | Marberg et al. | |
| 5,982,664 A | 11/1999 | Watanabe | |
| 6,000,006 A | 12/1999 | Bruce et al. | |
| 6,006,345 A | 12/1999 | Berry, Jr. | |
| 6,016,560 A | 1/2000 | Wada et al. | |
| 6,018,304 A | 1/2000 | Bessios | |
| 6,044,472 A | 3/2000 | Crohas | |
| 6,070,074 A | 5/2000 | Perahia et al. | |
| 6,119,250 A | 9/2000 | Nishimura et al. | |
| 6,138,261 A | 10/2000 | Wilcoxson et al. | |
| 6,182,264 B1 | 1/2001 | Ott | |
| 6,192,092 B1 | 2/2001 | Dizon et al. | |
| 6,295,592 B1 | 9/2001 | Jeddeloh | |
| 6,311,263 B1 | 10/2001 | Barlow et al. | |
| 6,408,394 B1 | 6/2002 | Vander Kamp et al. | |
| 6,412,042 B1 | 6/2002 | Paterson et al. | |
| 6,442,076 B1 | 8/2002 | Roohparvar | |
| 6,449,625 B1 | 9/2002 | Wang | |
| 6,484,224 B1 | 11/2002 | Robins et al. | |
| 6,516,437 B1 | 2/2003 | Van Stralen et al. | |
| 6,564,285 B1 | 5/2003 | Mills et al. | |
| 6,678,788 B1 | 1/2004 | O'Connell | |
| 6,757,768 B1 | 6/2004 | Potter et al. | |
| 6,775,792 B2 | 8/2004 | Ulrich et al. | |
| 6,810,440 B2 | 10/2004 | Micalizzi, Jr. et al. | |
| 6,836,808 B2 | 12/2004 | Bunce et al. | |
| 6,836,815 B1 | 12/2004 | Purcell et al. | |
| 6,842,436 B2 | 1/2005 | Moeller | |
| 6,865,650 B1 | 3/2005 | Morley et al. | |
| 6,871,257 B2 | 3/2005 | Conley et al. | |
| 6,895,464 B2 | 5/2005 | Chow et al. | |
| 6,966,006 B2 | 11/2005 | Pacheco et al. | |
| 6,978,343 B1 | 12/2005 | Ichiriu | |
| 6,980,985 B1 | 12/2005 | Amer-Yahia et al. | |
| 6,981,205 B2 | 12/2005 | Fukushima et al. | |
| 6,988,171 B2 | 1/2006 | Beardsley et al. | |
| 7,020,017 B2 | 3/2006 | Chen et al. | |
| 7,028,165 B2 | 4/2006 | Roth et al. | |
| 7,032,123 B2 | 4/2006 | Kane et al. | |
| 7,043,505 B1 | 5/2006 | Teague et al. | |
| 7,076,598 B2 | 7/2006 | Wang | |
| 7,100,002 B2 | 8/2006 | Shrader | |
| 7,102,860 B2 | 9/2006 | Wenzel | |
| 7,111,293 B1 | 9/2006 | Hersh et al. | |
| 7,126,873 B2 | 10/2006 | See et al. | |
| 7,133,282 B2 | 11/2006 | Sone | |
| 7,162,678 B2 | 1/2007 | Saliba | |
| 7,173,852 B2 | 2/2007 | Gorobets et al. | |
| 7,184,446 B2 | 2/2007 | Rashid et al. | |
| 7,275,170 B2 | 9/2007 | Suzuki | |
| 7,328,377 B1 | 2/2008 | Lewis et al. | |
| 7,516,292 B2 | 4/2009 | Kimura et al. | |
| 7,523,157 B2 | 4/2009 | Aguilar, Jr. et al. | |
| 7,527,466 B2 | 5/2009 | Simmons | |
| 7,529,466 B2 | 5/2009 | Takahashi | |
| 7,533,214 B2 | 5/2009 | Aasheim et al. | |
| 7,546,478 B2 | 6/2009 | Kubo et al. | |
| 7,566,987 B2 | 7/2009 | Black et al. | |
| 7,571,277 B2 | 8/2009 | Mizushima | |
| 7,574,554 B2 | 8/2009 | Tanaka et al. | |
| 7,596,643 B2 | 9/2009 | Merry, Jr. et al. | |
| 7,681,106 B2 | 3/2010 | Jarrar et al. | |
| 7,685,494 B1 | 3/2010 | Varnica et al. | |
| 7,707,481 B2 | 4/2010 | Kirschner et al. | |
| 7,761,655 B2 | 7/2010 | Mizushima et al. | |
| 7,765,454 B2 | 7/2010 | Passint | |
| 7,774,390 B2 | 8/2010 | Shin | |
| 7,840,762 B2 | 11/2010 | Oh et al. | |
| 7,870,326 B2 | 1/2011 | Shin et al. | |
| 7,890,818 B2 | 2/2011 | Kong et al. | |
| 7,913,022 B1 | 3/2011 | Baxter | |
| 7,925,960 B2 | 4/2011 | Ho et al. | |
| 7,934,052 B2 | 4/2011 | Prins et al. | |
| 7,945,825 B2 * | 5/2011 | Cohen et al. | 714/721 |
| 7,954,041 B2 | 5/2011 | Hong et al. | |
| 7,971,112 B2 | 6/2011 | Murata | |
| 7,974,368 B2 | 7/2011 | Shieh et al. | |
| 7,978,516 B2 | 7/2011 | Olbrich et al. | |
| 7,996,642 B1 | 8/2011 | Smith | |
| 8,006,161 B2 | 8/2011 | Lestable et al. | |
| 8,032,724 B1 | 10/2011 | Smith | |
| 8,041,884 B2 | 10/2011 | Chang | |
| 8,042,011 B2 | 10/2011 | Nicolaidis et al. | |
| 8,069,390 B2 | 11/2011 | Lin | |
| 8,190,967 B2 | 5/2012 | Hong et al. | |
| 8,250,380 B2 | 8/2012 | Guyot | |
| 8,254,181 B2 | 8/2012 | Hwang et al. | |
| 8,259,506 B1 | 9/2012 | Sommer et al. | |
| 8,312,349 B2 | 11/2012 | Reche et al. | |
| 8,412,985 B1 | 4/2013 | Bowers et al. | |
| 8,429,436 B2 | 4/2013 | Fillingim et al. | |
| 8,438,459 B2 | 5/2013 | Cho et al. | |
| 8,453,022 B2 | 5/2013 | Katz | |
| 8,627,117 B2 | 1/2014 | Johnston | |
| 8,634,248 B1 | 1/2014 | Sprouse et al. | |
| 8,694,854 B1 | 4/2014 | Dar et al. | |
| 8,724,789 B2 * | 5/2014 | Altberg et al. | 379/218.01 |
| 8,885,434 B2 | 11/2014 | Kumar | |
| 8,898,373 B1 | 11/2014 | Kang et al. | |
| 8,910,030 B2 | 12/2014 | Goel | |
| 8,923,066 B1 | 12/2014 | Subramanian et al. | |
| 9,128,690 B2 | 9/2015 | Lotzenburger et al. | |
| 2001/0050824 A1 | 12/2001 | Buch | |
| 2002/0024846 A1 | 2/2002 | Kawahara et al. | |
| 2002/0036515 A1 | 3/2002 | Eldridge et al. | |
| 2002/0083299 A1 | 6/2002 | Van Huben et al. | |
| 2002/0122334 A1 | 9/2002 | Lee et al. | |
| 2002/0152305 A1 | 10/2002 | Jackson et al. | |
| 2002/0162075 A1 | 10/2002 | Talagala et al. | |
| 2002/0165896 A1 | 11/2002 | Kim | |
| 2003/0041299 A1 | 2/2003 | Kanazawa et al. | |
| 2003/0043829 A1 | 3/2003 | Rashid et al. | |
| 2003/0079172 A1 | 4/2003 | Yamagishi et al. | |
| 2003/0088805 A1 | 5/2003 | Majni et al. | |
| 2003/0093628 A1 | 5/2003 | Matter et al. | |
| 2003/0163594 A1 | 8/2003 | Aasheim et al. | |
| 2003/0163629 A1 | 8/2003 | Conley et al. | |
| 2003/0188045 A1 | 10/2003 | Jacobson | |
| 2003/0189856 A1 | 10/2003 | Cho et al. | |
| 2003/0198100 A1 | 10/2003 | Matsushita et al. | |
| 2003/0204341 A1 | 10/2003 | Guliani et al. | |
| 2003/0212719 A1 | 11/2003 | Yasuda et al. | |
| 2004/0024957 A1 | 2/2004 | Lin et al. | |
| 2004/0024963 A1 | 2/2004 | Talagala et al. | |
| 2004/0057575 A1 | 3/2004 | Zhang et al. | |
| 2004/0062157 A1 | 4/2004 | Kawabe | |
| 2004/0073829 A1 | 4/2004 | Olarig | |
| 2004/0114265 A1 | 6/2004 | Talbert | |
| 2004/0143710 A1 | 7/2004 | Walmsley | |
| 2004/0148561 A1 | 7/2004 | Shen et al. | |
| 2004/0153902 A1 | 8/2004 | Machado et al. | |
| 2004/0167898 A1 | 8/2004 | Margolus et al. | |
| 2004/0181734 A1 | 9/2004 | Saliba | |
| 2004/0199714 A1 | 10/2004 | Estakhri et al. | |
| 2004/0237018 A1 | 11/2004 | Riley | |
| 2005/0060456 A1 | 3/2005 | Shrader et al. | |
| 2005/0060501 A1 | 3/2005 | Shrader | |
| 2005/0073884 A1 | 4/2005 | Gonzalez et al. | |

(56) References Cited

U.S. PATENT DOCUMENTS

| | | |
|---|---|---|
| 2005/0108588 A1 | 5/2005 | Yuan |
| 2005/0114587 A1 | 5/2005 | Chou et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0010174 A1 | 1/2006 | Nguyen et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0085671 A1 | 4/2006 | Majni et al. |
| 2006/0087893 A1 | 4/2006 | Nishihara et al. |
| 2006/0107181 A1 | 5/2006 | Dave et al. |
| 2006/0136570 A1 | 6/2006 | Pandya |
| 2006/0136681 A1 | 6/2006 | Jain et al. |
| 2006/0156177 A1 | 7/2006 | Kottapalli et al. |
| 2006/0195650 A1 | 8/2006 | Su et al. |
| 2006/0244049 A1 | 11/2006 | Yaoi et al. |
| 2006/0259528 A1 | 11/2006 | Dussud et al. |
| 2006/0291301 A1 | 12/2006 | Ziegelmayer |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0088716 A1 | 4/2007 | Brumme et al. |
| 2007/0091677 A1 | 4/2007 | Lasser et al. |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0156842 A1 | 7/2007 | Vermeulen et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0180346 A1 | 8/2007 | Murin |
| 2007/0201274 A1 | 8/2007 | Yu et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0245099 A1 | 10/2007 | Gray et al. |
| 2007/0263442 A1 | 11/2007 | Cornwall et al. |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0013390 A1 | 1/2008 | Zipprich-Rasch |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0056005 A1 | 3/2008 | Aritome |
| 2008/0071971 A1 | 3/2008 | Kim et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147714 A1 | 6/2008 | Breternitz et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0019216 A1 | 1/2009 | Yamada et al. |
| 2009/0031083 A1 | 1/2009 | Willis et al. |
| 2009/0037652 A1 | 2/2009 | Yu et al. |
| 2009/0070608 A1 | 3/2009 | Kobayashi |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0213649 A1 | 8/2009 | Takahashi et al. |
| 2009/0222708 A1 | 9/2009 | Yamaga |
| 2009/0228761 A1 | 9/2009 | Perlmutter et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0008175 A1 | 1/2010 | Sweere et al. |
| 2010/0011261 A1 | 1/2010 | Cagno et al. |
| 2010/0020620 A1 | 1/2010 | Kim et al. |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0118608 A1 | 5/2010 | Song et al. |
| 2010/0138592 A1 | 6/2010 | Cheon |
| 2010/0153616 A1 | 6/2010 | Garratt |
| 2010/0161936 A1 | 6/2010 | Royer et al. |
| 2010/0174959 A1 | 7/2010 | No et al. |
| 2010/0199125 A1 | 8/2010 | Reche |
| 2010/0199138 A1 | 8/2010 | Rho |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0332858 A1 | 12/2010 | Trantham et al. |
| 2011/0010514 A1 | 1/2011 | Benhase et al. |
| 2011/0051513 A1 | 3/2011 | Shen et al. |
| 2011/0066597 A1 | 3/2011 | Mashtizadeh et al. |
| 2011/0072302 A1 | 3/2011 | Sartore |
| 2011/0078407 A1 | 3/2011 | Lewis |
| 2011/0083060 A1 | 4/2011 | Sakurada et al. |
| 2011/0099460 A1* | 4/2011 | Dusija et al. ............... 714/773 |
| 2011/0113281 A1 | 5/2011 | Zhang et al. |
| 2011/0122691 A1 | 5/2011 | Sprouse |
| 2011/0131444 A1 | 6/2011 | Buch et al. |
| 2011/0138260 A1 | 6/2011 | Savin |
| 2011/0173378 A1 | 7/2011 | Filor et al. |
| 2011/0179249 A1 | 7/2011 | Hsiao |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0222342 A1 | 9/2011 | Yoon et al. |
| 2011/0225346 A1 | 9/2011 | Goss et al. |
| 2011/0228601 A1 | 9/2011 | Olbrich et al. |
| 2011/0231600 A1 | 9/2011 | Tanaka et al. |

(56) References Cited

U.S. PATENT DOCUMENTS

| | | |
|---|---|---|
| 2011/0239077 A1 | 9/2011 | Bai et al. |
| 2011/0264843 A1 | 10/2011 | Haines et al. |
| 2011/0271040 A1 | 11/2011 | Kamizono |
| 2011/0283119 A1 | 11/2011 | Szu et al. |
| 2011/0289125 A1 | 11/2011 | Guthery |
| 2012/0023144 A1 | 1/2012 | Rub |
| 2012/0054414 A1 | 3/2012 | Tsai et al. |
| 2012/0063234 A1 | 3/2012 | Shiga et al. |
| 2012/0072639 A1 | 3/2012 | Goss et al. |
| 2012/0096217 A1 | 4/2012 | Son et al. |
| 2012/0110250 A1 | 5/2012 | Sabbag et al. |
| 2012/0117317 A1 | 5/2012 | Sheffler |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0173797 A1 | 7/2012 | Shen |
| 2012/0185750 A1 | 7/2012 | Hayami |
| 2012/0195126 A1 | 8/2012 | Roohparvar |
| 2012/0203951 A1 | 8/2012 | Wood et al. |
| 2012/0210095 A1 | 8/2012 | Nellans et al. |
| 2012/0216079 A1 | 8/2012 | Fai et al. |
| 2012/0233391 A1 | 9/2012 | Frost et al. |
| 2012/0236658 A1 | 9/2012 | Byom et al. |
| 2012/0239858 A1 | 9/2012 | Melik-Martirosian |
| 2012/0239976 A1 | 9/2012 | Cometti et al. |
| 2012/0259863 A1 | 10/2012 | Bodwin et al. |
| 2012/0275466 A1 | 11/2012 | Bhadra et al. |
| 2012/0278564 A1 | 11/2012 | Goss et al. |
| 2012/0284574 A1 | 11/2012 | Avila et al. |
| 2012/0284587 A1 | 11/2012 | Yu et al. |
| 2013/0007073 A1 | 1/2013 | Varma |
| 2013/0007343 A1 | 1/2013 | Rub et al. |
| 2013/0007543 A1 | 1/2013 | Goss et al. |
| 2013/0024735 A1 | 1/2013 | Chung et al. |
| 2013/0031438 A1 | 1/2013 | Hu et al. |
| 2013/0036418 A1 | 2/2013 | Yadappanavar et al. |
| 2013/0047045 A1 | 2/2013 | Hu et al. |
| 2013/0073924 A1 | 3/2013 | D'Abreu et al. |
| 2013/0079942 A1 | 3/2013 | Smola et al. |
| 2013/0086131 A1 | 4/2013 | Hunt et al. |
| 2013/0086132 A1 | 4/2013 | Hunt et al. |
| 2013/0094288 A1 | 4/2013 | Patapoutian et al. |
| 2013/0111279 A1 | 5/2013 | Jeon et al. |
| 2013/0111298 A1 | 5/2013 | Seroff et al. |
| 2013/0121084 A1 | 5/2013 | Jeon et al. |
| 2013/0124888 A1 | 5/2013 | Tanaka et al. |
| 2013/0128666 A1 | 5/2013 | Avila et al. |
| 2013/0132652 A1 | 5/2013 | Wood et al. |
| 2013/0176784 A1 | 7/2013 | Cometti et al. |
| 2013/0179646 A1 | 7/2013 | Okubo et al. |
| 2013/0191601 A1 | 7/2013 | Peterson et al. |
| 2013/0194865 A1 | 8/2013 | Bandic et al. |
| 2013/0194874 A1 | 8/2013 | Mu et al. |
| 2013/0232289 A1 | 9/2013 | Zhong et al. |
| 2013/0254507 A1 | 9/2013 | Islam et al. |
| 2013/0258738 A1 | 10/2013 | Barkon et al. |
| 2013/0265838 A1 | 10/2013 | Li |
| 2013/0282955 A1 | 10/2013 | Parker et al. |
| 2013/0290611 A1 | 10/2013 | Biederman et al. |
| 2013/0301373 A1 | 11/2013 | Tam |
| 2013/0304980 A1 | 11/2013 | Nachimuthu et al. |
| 2013/0343131 A1 | 12/2013 | Wu et al. |
| 2014/0013188 A1 | 1/2014 | Wu et al. |
| 2014/0063905 A1 | 3/2014 | Ahn et al. |
| 2014/0075133 A1 | 3/2014 | Li et al. |
| 2014/0082261 A1 | 3/2014 | Cohen at al. |
| 2014/0082456 A1 | 3/2014 | Liu |
| 2014/0095775 A1 | 4/2014 | Talagala et al. |
| 2014/0122818 A1 | 5/2014 | Hayasaka et al. |
| 2014/0136883 A1 | 5/2014 | Cohen |
| 2014/0136927 A1 | 5/2014 | Li et al. |
| 2014/0143505 A1 | 5/2014 | Sim et al. |
| 2014/0201596 A1 | 7/2014 | Baum et al. |
| 2014/0223084 A1 | 8/2014 | Lee et al. |
| 2014/0258755 A1 | 9/2014 | Stenfort |
| 2014/0269090 A1 | 9/2014 | Flynn et al. |
| 2014/0359381 A1 | 12/2014 | Takeuchi et al. |
| 2015/0023097 A1 | 1/2015 | Khoueir et al. |
| 2015/0153799 A1 | 6/2015 | Lucas et al. |

FOREIGN PATENT DOCUMENTS

| | | |
|---|---|---|
| EP | 1 990 921 A2 | 11/2008 |
| EP | 2 386 958 A1 | 11/2011 |
| EP | 2 620 946 A2 | 7/2013 |
| JP | 2002-532806 S | 10/2002 |
| WO | WO 2007/036834 A2 | 4/2007 |
| WO | WO 2007/080586 A2 | 7/2007 |
| WO | WO 2008/075292 | 6/2008 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |
| WO | WO 2011/024015 | 3/2011 |

OTHER PUBLICATIONS

Lee et al., "A Semi-Preemptive Garbage Collector for Solid State Drives," Apr. 2011, IEEE, pp. 12-21.
Office Action dated Feb. 17, 2015, received in Chinese Patent Application No. 201210334937.1, which corresponds to U.S. Appl. No. 12/082,207, 9 pages (Prins).
International Search Report and Written Opinion dated May 4, 2015, received in international Patent Application No. PCT/US2014/065987, which corresponds to U.S. Appl. No. 14/135,400, 12 pages (George).
International Search Report and Written Opinion dated Mar. 17. 2015, received in International Patent Application No. PCT/US2014/067487, which corresponds to U.S. Appl. No. 14/135,420, 13 pages (Lucas).
International Search Report and Written Opinion dated Apr. 20, 2015, received in International Patent Application No. PCT/US2014/063949, which corresponds to U.S. Appl. No. 14/135,433, 21 pages (Deipapa).
International Search Report and Written Opinion dated Mar. 9, 2015, received in International Patent Application No. PCT/US2014/059747, which corresponds to U.S. Appl. No. 14/137,440, 9 pages (Fitzpatrick).
Barr, Introduction to Watchdog Timers, Oct. 2001, 3 pgs.
Canim, Buffered Bloom ilters on Solid State Storage, ADMS*10, Singapore, Sep. 13-17, 2010, 8 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology—AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009. 8 pgs.

(56) References Cited

OTHER PUBLICATIONS

Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
Sandisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jun. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
International Search Report and Written Opinion dated Jul. 25, 2014, received in International Patent Application No. PCT/US2014/029453, which corresponds to U.S. Appl. No. 13/963,444, 9 pages (Frayer).
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
Invitation to Pay Additional Fees dated Feb. 13, 2015, received in International Patent Application No. PCT/US2014/063949, which corresponds to U.S. Appl. No. 14/135,433, 6 pages (Delpapa).

International Search Report and Written Opinion dated Jan. 21, 2015, received in International Application No. PCT/US2014/059748, which corresponds to U.S. Appl. No. 14/137,511, 13 pages (Dancho).
International Search Report and Written Opinion dated Feb. 18, 2015, received in International Application No. PCT/US2014/066921, which corresponds to U.S. Appl. No. 14/135,260, 13 pages (Fitzpatrick).
Office Action dated Dec. 8, 2014, received in Chinese Patent Application No. 201180021660.2, which corresponds to U.S. Appl. No. 12/726,200, 7 pages (Olbrich).
Office Action dated Jul. 31, 2015, received in Chinese Patent Application No. 201180021660.2, which corresponds to U.S. Appl. No. 12/726,200, 9 pages (Olbrich).
International Search Report and Written Opinion dated Sep. 14, 2015, received in International Patent Application No. PCT/US2015/036807, which corresponds to U.S. Appl. No. 14/311,152, 9 pages (Higgins).
Bhattacharjee et al., "Efficient Index Compression in DB2 Luw", IBM Research Report, Jun. 23, 2009, http://domino.research.ibm.com/library/cyberdig.nsf/papers/40B2C45876D0D747852575E100620CE7/$File/rc24815.pdf, 13 pages.
International Search Report and Written Opinion dated Jun. 8, 2015, received in International Patent Application No. PCT/US2015/018252, which corresponds to U.S. Appl. No. 14/339,072, 9 pages (Busch).
International Search Report and Written Opinion dated Jun. 2, 2015, received in International Patent Application No. PCT/US2015/018255, which corresponds to U.S. Appl. No. 14/336,967, 14 pages (Chander).
International Search Report and Written Opinion dated Jun. 30, 2015, received in International Patent Application No. PCT/US2015/023927, which corresponds to U.S. Appl. No. 14/454,687, 11 pages (Kadayam).
Bayer, "Prefix B-Trees", IP.Com Journal, IP.Com Inc., West Henrietta, NY, Mar. 30, 2007, 29 pages.
Bhattacharjee et al., "Efficient Index Compression in DB2 LUW", IBM Research Report, Jun. 23, 2009, http://domino.research.ibm.com/library/cyberdig.nsf/papers/40B2C45876D0D747852575E100620CE7$File/rc24815.pdf, 13 pages.
Oracle, "Oracle9i: Database Concepts", Jul. 2001, http://docs.oracle.com/cd/A91202_01/901_doc/server.901/a88856.pdf, 49 pages.
International Search Report and Written Opinion dated Jun. 8, 2015, received in International Patent Application No. PCT/US2015/018252, which corresponds to U.S. Appl. No. 14/339,072, 9 pages. (Busch).
International Search Report and Written Opinion dated Jun. 2, 2015, received in International Patent Application No. PCT/US2015/018255, which corresponds to U.S. Appl. No. 14/336,967, 14 pages. (Chander).
International Search Report and Written Opinion dated Jun. 30, 2015, received in International Patent Application No. PCT/US2015/023927, which corresponds to U.S. Appl. No. 14/454,687, 11 pages. (Kadayam).
International Search Report and Written Opinion dated Jul. 23, 2015, received in International Patent Application No. PCT/US2015/030850, which corresponds to U.S. Appl. No. 14/298,843, 12 pages (Ellis).
IBM Research-Zurich, "The Fundamental Limit of Flash Random Write Performance: Understanding, Analysis and Performance Modeling," Mar. 31, 2010, pp. 1-15.

* cited by examiner

| PE \ $V_R$ | $V_{RA}$ | $V_{RB}$ | $V_{RC}$ |
|---|---|---|---|
| Default | α | β | γ |
| X cycles | $\Delta A_X$ | $\Delta B_X$ | $\Delta C_X$ |
| 2X cycles | $\Delta A_{2X}$ | $\Delta B_{2X}$ | $\Delta C_{2X}$ |
| ⋮ | ⋮ | ⋮ | ⋮ |
| nX cycles | $\Delta A_{nX}$ | $\Delta A_{nX}$ | $\Delta A_{nX}$ |

Figure 7A

| PE \ $V_R$ | $V_{RA}$(wl1) | $V_{RA}$(wl2) | $V_{RA}$(wl3) | $V_{RB}$(wl1) | ••• | $V_{RC}$(wl3) |
|---|---|---|---|---|---|---|
| Default | α(wl1) | α(wl2) | α(wl3) | β(wl1) | ••• | γ(wl3) |
| X cycles | $\Delta A_X$(wl1) | $\Delta A_X$(wl2) | $\Delta A_X$(wl3) | $\Delta B_X$(wl1) | ••• | $\Delta C_X$(wl3) |
| 2X cycles | $\Delta A_{2X}$(wl1) | $\Delta A_{2X}$(wl1) | $\Delta A_{2X}$(wl1) | $\Delta B_{2X}$(wl1) | ••• | $\Delta C_{2X}$(wl3) |
| ⋮ | ⋮ | ⋮ | ⋮ | ⋮ | ⋮ | ⋮ |
| nX cycles | $\Delta A_{nX}$(wl1) | $\Delta A_{nX}$(wl2) | $\Delta A_{nX}$(wl3) | $\Delta B_{nX}$(wl1) | ••• | $\Delta C_{nX}$(wl3) |

Figure 7B

SYSTEM AND METHOD FOR UPDATING A READING THRESHOLD VOLTAGE BASED ON SYMBOL TRANSITION INFORMATION

RELATED APPLICATIONS

This application claims priority to U.S. Provisional Patent Application 61/800,034, filed Mar. 15, 2013, which is hereby incorporated by reference in its entirety.

TECHNICAL FIELD

The present disclosure relates to memory systems, and in particular, to improving the reliability of memory systems.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Increases in storage density have been facilitated in various ways, including increasing the density of memory cells on a chip enabled by manufacturing developments, and transitioning from single-level flash memory cells to multi-level flash memory cells, so that two or more bits can be stored by each flash memory cell.

A drawback of increasing storage density is that the stored data is increasingly prone to being stored and/or read erroneously. An error control coding (ECC) engine is utilized to limit the number of uncorrectable errors that are introduced by electrical fluctuations, defects in the storage medium, operating conditions, device history, and/or write-read circuitry, etc.

SUMMARY

The embodiments described herein provide a method and system to minimize the burden on the ECC engine of a persistent storage device or persistent storage controller and to enhance the reliability of the persistent storage device. The system does not wait to be triggered by uncorrectable errors detected by the ECC engine and instead operates as a tracking system during normal memory read operations. The system utilizes symbol transition information (e.g., soft information, including transition probabilities or log-likelihood ratios (LLRs)) obtained during normal memory read operations to generate one or more updated reading threshold voltages so as to provide for more reliable reads from and writes to a persistent storage medium. The system generates the one or more updated reading threshold voltages without the usage of extraneous read operations, which introduce latency and impact performance.

In some embodiments, the system obtains symbol transition information (e.g., soft information), which is information corresponding to symbol read errors identified while reading data from flash memory cells in a flash memory device, during normal memory read operations. In some implementations, obtaining symbol transition information includes identifying symbol read errors for a set of reference cells in respective codewords of the data read in response to one or more host read commands (e.g., the set of reference cells for a respective codeword contain $n \cdot 2^n$ bits of information). In some other implementations, obtaining symbol transition information includes identifying symbol read errors by comparing corrected read data from an ECC decoder and corresponding raw data (sometimes called hard decision data) read in response to the one or more host read commands (e.g., collected during one or more read patrol operations).

In another aspect, the system utilizes the symbol transition information to determine a reading threshold voltage offset. The reading threshold voltage offset is determined based at least in part on a plurality of probability values (e.g., transition probabilities or LLRs) determined from the symbol transition information. Furthermore, the system generates an updated reading threshold voltage in accordance with the reading threshold voltage offset and the current value of the reading threshold voltage.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 7A is a look-up table (LUT) that may be associated with one or more reading threshold voltages, in accordance with some embodiments.

FIG. 7B is a look-up table (LUT) that may be associated with one or more reading threshold voltages for each of a plurality of word line zones, in accordance with some embodiments.

Figure 1:
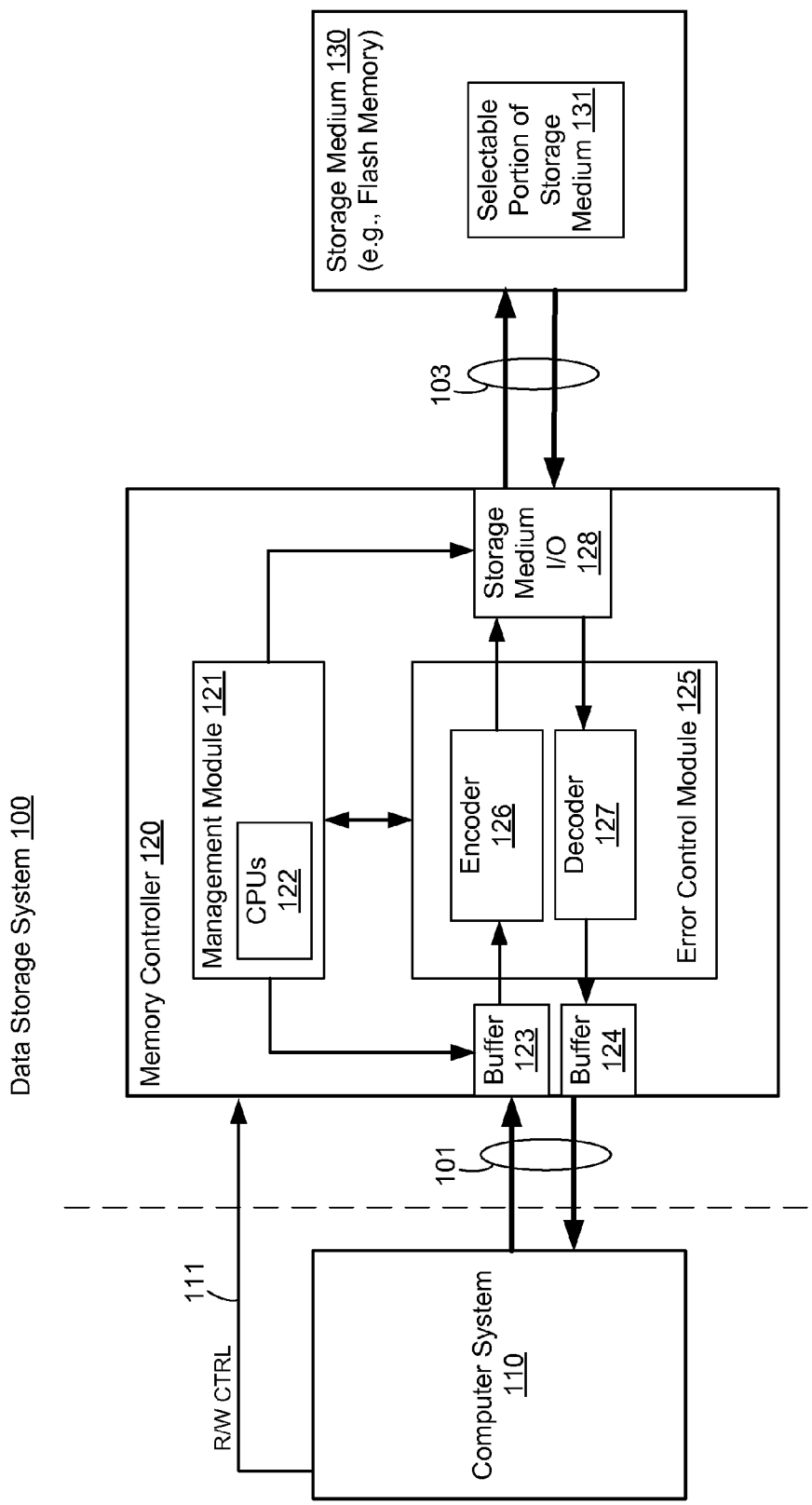
FIG. 1 is a diagram of an implementation of a data storage environment, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to improve the reliability of a storage medium, such as a flash memory device. Some implementations include systems, methods and/or devices to obtain and utilize symbol transition information, which is information corresponding to symbol read errors, also called symbol transitions, identified while reading data from the flash memory cells in the flash memory device) for updating a reading threshold voltage used for reading symbols from a storage medium.

More specifically, some implementations include a method for reading data from flash memory cells in a flash memory device in response to one or more first host read commands from a host device and in accordance with the one or more first host read commands and a current value of a reading threshold voltage. The method includes obtaining symbol transition information corresponding to symbol read errors identified while reading data from the flash memory cells in the flash memory device in accordance with the one or more first host read commands and the current value of the reading threshold voltage. The method further includes determining a reading threshold voltage offset, based at least in part on: a) a first factor based on a plurality of probability values determined from the symbol transition information; b) a second factor based on a current count of program-erase cycles; and c) a third factor based on a word line zone value for a word line zone containing the flash memory cells from which the data was read in response to the one or more first host read commands. Next, the method includes generating an updated reading threshold voltage in accordance with the reading threshold voltage offset and the current value of the reading threshold voltage. Finally, the method includes reading data, in response to one or more second host read commands, different from the one or more first host read commands received from the host device, from the flash memory cells in accordance with the one or more second host read commands and the updated reading threshold voltage.

In some embodiments, obtaining symbol transition information includes obtaining symbol transition information for a set of reference cells in respective codewords of the data read in response to the one or more first host read commands. In some embodiments, the set of reference cells of each respective codeword contains $n \cdot 2^n$ bits of information, where n is the number of bits stored per flash memory cell.

In some embodiments, obtaining symbol transition information includes receiving corrected read data from an ECC decoder and corresponding raw data read in response to the one or more first host read commands. In some embodiments, the read data is collected during a read patrol operation.

In some embodiments, the method comprises determining the reading threshold voltage offset every X program-erase cycles, where X is an integer.

In some embodiments, the method further comprises determining a plurality of reading threshold voltage offsets, wherein the plurality of reading threshold voltage offsets is equal to $2^n-1$ reading threshold voltage offsets, where n is the number of bits stored per flash memory cell.

In some embodiments, the first factor is based on a ratio of a first set of probability values determined from a first set of symbol transition information to a second set of a probability values determined from a second set of symbol transition information, wherein the second set of symbol transition information was generated at time T-2 and the first set of symbol transition information is generated at time T-1.

In some embodiments, the second factor is based on a cumulative count of program-erase cycles for the flash memory device or a predefined portion of the flash memory device.

In some embodiments, the flash memory device includes a plurality of word line zones. In some embodiments, the method comprises generating an updated reading threshold voltage for each of the plurality of word line zones.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a diagram of an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, the data storage system 100 includes a memory controller 120, and a storage medium 130, and is used in conjunction with a computer system 110. In some implementations, storage medium 130 is a single flash memory device while in other implementations storage medium 130 includes a plurality of flash memory devices. In some implementations, storage medium 130 is NAND-type flash memory or NOR-type flash memory. Further, in some implementations memory controller 120 is a solid-state drive (SSD) controller. However, other types of storage media may be included in accordance with aspects of a wide variety of implementations.

Computer system 110 is coupled to memory controller 120 through data connections 101. However, in some implementations computer system 110 includes memory controller 120 as a component and/or a sub-system. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some implementations, computer system 110 includes one or more processors, one or more types of memory, a display and/or other user interface components such as a keyboard, a touch screen display, a mouse, a trackpad, a digital camera and/or any number of supplemental devices to add functionality.

Storage medium 130 is coupled to memory controller 120 through connections 103. Connections 103 are sometimes called data connections, but typically convey commands in addition to data, and optionally convey metadata, error correction information and/or other information in addition to data values to be stored in storage medium 130 and data values read from storage medium 130. In some implementations, however, memory controller 120 and storage medium 130 are included in the same device as components thereof. Furthermore, in some implementations memory controller 120 and storage medium 130 are embedded in a host device, such as a mobile device, tablet, other computer or computer controlled device, and the methods described herein are performed by the embedded memory controller. Storage medium 130 may include any number (i.e., one or more) of memory devices including, without limitation, non-volatile semiconductor memory devices, such as flash memory. For example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

Storage medium 130 is divided into a number of addressable and individually selectable blocks, such as selectable portion 131. In some implementations, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some implementations (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

For example, one block comprises any number of pages, for example, 64 pages, 128 pages, 256 pages or another suitable number of pages. Blocks are typically grouped into a plurality of zones. Each block zone can be independently managed to some extent, which increases the degree of parallelism for parallel operations and simplifies management of storage medium 130.

As noted above, while data storage densities of non-volatile semiconductor memory devices are generally increasing, a drawback of increasing storage density is that the stored data is more prone to being stored and/or read erroneously. As described in greater detail below, error control coding can be utilized to limit the number of uncorrectable errors that are introduced by electrical fluctuations, defects in the storage medium, operating conditions, device history, write-read circuitry, etc., or a combination of these and various other factors.

In some implementations, memory controller 120 includes a management module 121, an input buffer 123, an output buffer 124, an error control module 125 and a storage medium interface (I/O) 128. Memory controller 120 may include various additional features that have not been illustrated for the sake of brevity and so as not to obscure more pertinent features of the example implementations disclosed herein, and that a different arrangement of features may be possible. Input and output buffers 123,124 provide an interface to computer system 110 through data connections 101. Similarly, storage medium I/O 128 provides an interface to storage medium 130 though connections 103. In some implementations, storage medium I/O 128 includes read and write circuitry, including circuitry capable of providing reading signals to storage medium 130 (e.g., reading threshold voltages for NAND-type flash memory).

In some implementations, management module 121 includes one or more processing units (CPUs, also sometimes called processors) 122 configured to execute instructions in one or more programs (e.g., in management module 121). In some implementations, the one or more CPUs 122 are shared by one or more components within, and in some cases, beyond the function of memory controller 120. Management module 121 is coupled to input buffer 123, output buffer 124 (connection not shown), error control module 125 and storage medium I/O 128 in order to coordinate the operation of these components.

Error control module 125 is coupled to storage medium I/O 128, input buffer 123 and output buffer 124. Error control module 125 is provided to limit the number of uncorrectable errors inadvertently introduced into data. In some embodiments, error control module 125 is executed in software by the one or more CPUs 122 of management module 121, and, in other embodiments, error control module 125 is implemented in whole or in part using special purpose circuitry to perform encoding and decoding functions. To that end, error control module 125 includes an encoder 126 and a decoder 127. Encoder 126 encodes data by applying an error control code to produce a codeword, which is subsequently stored in storage medium 130.

When the encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand some algorithms, such as the Viterbi algorithm, may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 130 from computer system 110. The data held in input buffer 123 is made available to encoder 126, which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands on control line 111 to memory controller 120 requesting data from storage medium 130. Memory controller 120 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to decoder 127. If the decoding is successful, the decoded data is provided to output buffer 124, where the decoded data is made available to computer system 110. In some implementations, if the decoding is not successful, memory controller 120 may resort to a number of remedial actions or provide an indication of an irresolvable error condition.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to a flash memory cells are gate voltages applied to the gates of the flash memory cells to determine whether the memory cells conduct current at that gate voltage. In some implementations, when a flash memory cell's transistor conducts current at a given reading threshold voltage, indicating that the cell voltage is less than the reading threshold voltage, the raw data value for that read operation is a "1" and otherwise the raw data value is a "0."

As discussed below with reference to FIG. 2A, a single-level flash memory cell (SLC) stores one bit ("0" or "1"). Thus, the storage density of an SLC memory device is one bit of information per memory cell. A multi-level flash memory cell (MLC), however, can store two or more bits of information per cell by using different ranges within the total voltage range of the memory cell to represent a multi-bit bit-tuple. In turn, the storage density of an MLC memory device is multiple-bits per cell (e.g., two bits per memory cell).

Figure 2A:
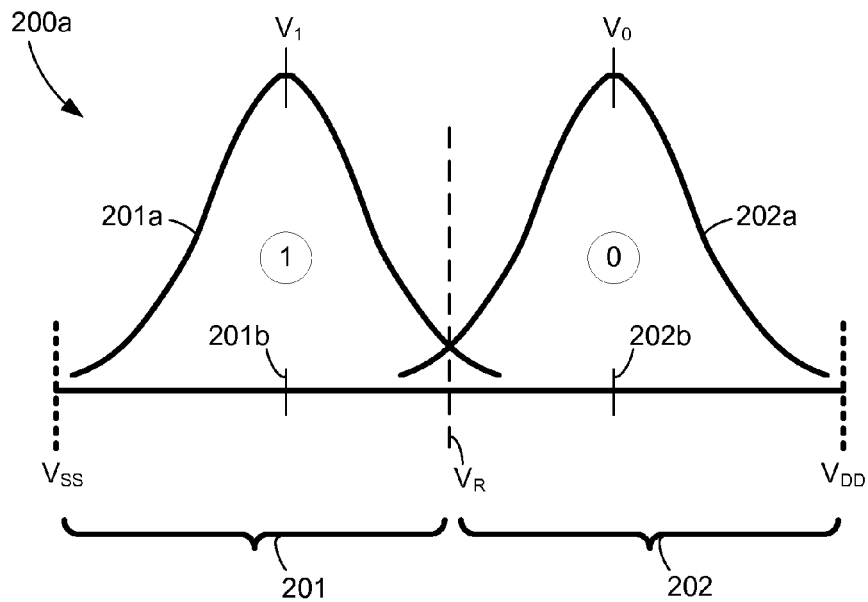
FIG. 2A is a prophetic diagram of voltage distributions that may be found in a single-level flash memory cell (SLC) over time, in accordance with some embodiments.

FIG. 2A is a simplified, prophetic diagram of voltage distributions 200a found in a single-level flash memory cell (SLC) over time. The voltage distributions 200a shown in FIG. 2A have been simplified for illustrative purposes. In this example, the SLC's voltage range extends approximately from a voltage, $V_{SS}$, at a source terminal of an NMOS transistor to a voltage, $V_{DD}$, at a drain terminal of the NMOS transistor. As such, voltage distributions 200a extend between $V_{SS}$ and $V_{DD}$.

Sequential voltage ranges 201 and 202 between source voltage $V_{SS}$ and drain voltage $V_{DD}$ are used to represent corresponding bit values "1" and "0," respectively. Each voltage range 201, 202 has a respective center voltage $V_1$ 201b, $V_0$ 202b. As described above, in many circumstances the memory cell current sensed in response to an applied reading threshold voltages is indicative of a memory cell voltage different from the respective center voltage $V_1$ 201b or $V_0$ 202b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 201, 202 also has a respective voltage distribution 201a, 202a that may occur as a result of any number of a combination of error-inducing factors, examples of which are identified above.

In some implementations, a reading threshold voltage $V_R$ is applied between adjacent center voltages (e.g., applied proximate to the halfway region between adjacent center voltages $V_1$ 201b and $V_0$ 202b). Optionally, in some implementations, the reading threshold voltage is located between voltage ranges 201 and 202. In some implementations, reading threshold voltage $V_R$ is applied in the region proximate to where the voltage distributions 201a and 202a overlap, which is not necessarily proximate to the halfway region between adjacent center voltages $V_1$ 201b and $V_0$ 202b.

In order to increase storage density in flash memory, flash memory has developed from single-level (SLC) cell flash memory to multi-level cell (MLC) flash memory so that two or more bits can be stored by each memory cell. As discussed below with reference to FIG. 2B, an MLC flash memory device is used to store multiple bits by using voltage ranges within the total voltage range of the memory cell to represent different bit-tuples. An MLC flash memory device is typically more error prone than an SLC flash memory device created using the same manufacturing process because the effective voltage difference between the voltages used to store different data values is smaller for an MLC flash memory device. Moreover, due to any number of a combination of factors, such as electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below with reference to FIG. 2B, the impact of such errors can be reduced by gray-coding the data, such that adjacent voltage ranges represent single-bit changes between bit-tuples.

Figure 2B:
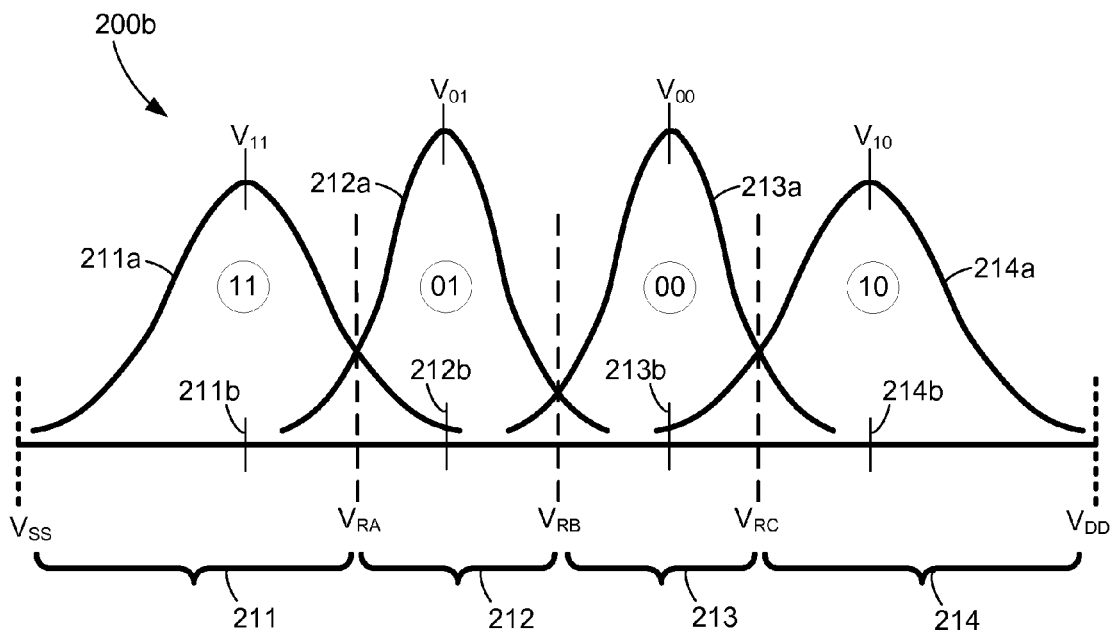
FIG. 2B is a prophetic diagram of voltage distributions that may be found in a multi-level flash memory cell (MLC) over time, in accordance with some embodiments.

FIG. 2B is a simplified, prophetic diagram of voltage distributions 200b that may be found in a multi-level flash memory cell (MLC) over time. The voltage distributions 200b shown in FIG. 2B have been simplified for illustrative purposes. The cell voltage of an MLC approximately extends from a voltage, $V_{SS}$, at the source terminal of a NMOS transistor to a voltage, $V_{DD}$, at the drain terminal. As such, voltage distributions 200b extend between $V_{SS}$ and $V_{DD}$.

Sequential voltage ranges 211, 212, 213, 214 between the source voltage $V_{SS}$ and drain voltages $V_{DD}$ are used to represent corresponding bit-tuples "11," "01," "00," "10," respectively. Each voltage range 211, 212, 213, 214 has a respective center voltage 211b, 212b, 213b, 214b. Each voltage range 211, 212, 213, 214 also has a respective voltage distribution 211a, 212a, 213a, 214a that may occur as a result of any number of a combination of factors, such as electrical fluctuations, defects in the storage medium, operating conditions, device history (e.g., number of program-erase (PE) cycles), and/or imperfect performance or design of write-read circuitry.

Ideally, during a write operation, the charge on the floating gate of the MLC would be set such that the resultant cell voltage is at the center of one of the ranges 211, 212, 213, 214 in order to write the corresponding bit-tuple to the MLC. Specifically, the resultant cell voltage would be set to one of $V_{11}$ 211b, $V_{10}$ 212b, $V_{00}$ 213b and $V_{10}$ 214b in order to write a corresponding one of the bit-tuples "11," "01," "00" and "10." In reality, due to the factors mentioned above, the initial cell voltage may differ from the center voltage for the data written to the MLC.

Reading threshold voltages $V_{RA}$, $V_{RB}$ and $V_{RC}$ are positioned between adjacent center voltages (e.g., positioned at or near the halfway point between adjacent center voltages) and, thus, define threshold voltages between the voltage ranges 211, 212, 213, 214. During a read operation, one of the reading threshold voltages $V_{RA}$, $V_{RB}$ and $V_{RC}$ is applied to determine the cell voltage using a comparison process. However, due to the various factors discussed above, the actual cell voltage, and/or the cell voltage received when reading the MLC, may be different from the respective center voltage $V_{11}$ 211b, $V_{10}$ 212b, $V_{00}$ 213b or $V_{10}$ 214b corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drift" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift."

One way to reduce the impact of a cell voltage drifting from one voltage range to an adjacent voltage range is to gray-code the bit-tuples. Gray-coding the bit-tuples includes constraining the assignment of bit-tuples such that a respective bit-tuple of a particular voltage range is different from a respective bit-tuple of an adjacent voltage range by only one bit. For example, as shown in FIG. 2B, the corresponding bit-tuples for adjacent ranges 201 and 202 are respectively "11" and "01," the corresponding bit-tuples for adjacent ranges 202 and 203 are respectively "01" and "00," and the corresponding bit-tuples for adjacent ranges 203 and 204 are respectively "00" and "10." Using gray-coding, if the cell voltage drifts close to a read comparison voltage level, the error is typically limited to a single bit within the 2-bit bit-tuple.

Figure 3:
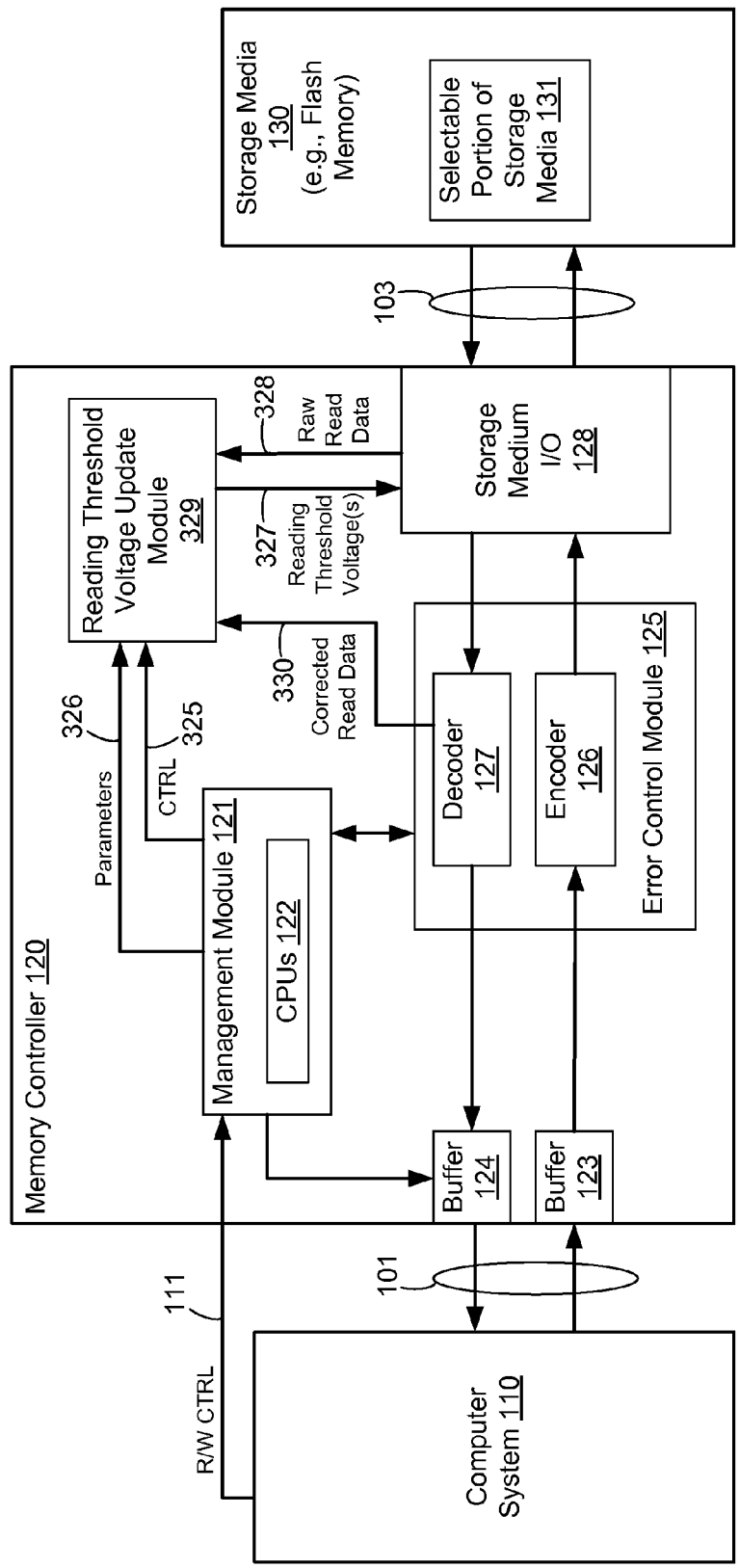
FIG. 3 is a diagram of an implementation of a data storage environment, including a reading threshold voltage update module, in accordance with some embodiments.

FIG. 3 is a diagram of an implementation of a data storage environment 300 that utilizes symbol transition information obtained during normal memory read operations to enhance the reliability of a storage medium, in accordance with some embodiments. Data storage environment 300 illustrated in FIG. 3 is similar to and adapted from data storage environment 100 illustrated in FIG. 1. Elements common to each include common reference numbers, and only the differences between FIGS. 1 and 3 are described herein for the sake of brevity. Moreover, while certain specific features are illustrated, those skilled in the art will appreciate from the present disclosure that various other features have not been illustrated for the sake of brevity and so as not to obscure more pertinent aspects of the example implementations disclosed herein.

To that end, as a non-limiting example, data storage environment 300, and in particular memory controller 120, has been further configured to obtain symbol transition information corresponding to symbol read errors identified while reading a portion of the storage medium during normal memory read operations. Memory controller 120 is also further configured to utilize the symbol transition information and one or more storage medium characterization parameter values to update a reading threshold voltage associated with the read portion of the storage medium.

More specifically, the memory controller 120 additionally includes a reading threshold voltage update module 329, in accordance with some embodiments. As described in greater detail below with reference to FIG. 4, in some implementations, reading threshold voltage update module 329 generates an updated reading threshold voltage associated with a portion of a storage medium based at least in part on symbol transition information obtained during normal memory read operations and one or more storage medium characterization parameter values.

Reading threshold voltage update module 329 is coupled to management module 121, error control module 125 and storage medium I/O 128. More specifically, management module 121 is coupled to provide reading threshold voltage update module 329 one or more host read commands and one or more storage medium characterization parameter values on a control line 325 and a data line 326, respectively. Storage medium I/O 128 is coupled to receive one or more read access commands including one or more reading threshold voltages (e.g., including one or more updated reading threshold voltages) from reading threshold voltage update module 329 via data line 327, to be provided to storage medium 130 for use when reading data. Storage medium I/O 128 is further coupled to provide reading threshold voltage update module 329 raw read data via data line 328 resulting from a read operation, in accordance with some embodiments. Alternatively, in some implementations, decoder 127 provides reading threshold voltage update module 329 raw read data. In some embodiments, decoder 127 (a component of error control module 125) is coupled to provide reading threshold voltage update module 329 corrected read data via data line 330. In some implementations, management module 121 includes reading threshold voltage update module 329.

A read operation is initiated when computer system (host) 110 (or the like) requests data from storage medium 130 by sending one or more host read commands on control line 111 to management module 121 (a component of memory controller 120). In some other implementations, management module 121 either maintains one or more storage medium characterization parameter values, associated with a portion of storage medium 130, on an ongoing basis, or retrieves the one or more medium characterization parameter values in response to receiving the one or more host read commands from computer system 110. Management module 121, in turn, passes information, including the one or more medium characterization parameter values, to reading threshold voltage update module 329 via control line 325 in response to the host read commands. In some implementations, reading threshold voltage update module 329 receives one or more storage medium characterization parameter values via data line 326, associated with a portion of storage medium 130, and optionally receives additional information associated with the one or more host read commands. In some implementations, reading threshold voltage update module 329 retrieves the one or more storage medium characterization parameter values from one of management module 121 or a storage medium characterization parameter value storage module (e.g., characterization module 420 in FIG. 4) in response to the one or more host read commands.

In some implementations, the one or more storage medium characterization parameter values provide an indication of at least one of a physical characteristic associated with at least a portion the storage medium (e.g., a distinct die, block zone, block, word line, word line zone or page portion of storage medium 130), a mode of operation associated with at least a portion of the storage medium, a history of use associated with at least a portion of the storage medium, a condition characteristic associated with at least a portion of the storage medium, a read type associated with at least a portion of the storage medium, and a location associated with at least a portion of the storage medium. In some implementations, the one or more storage medium characterization parameter values includes an indicator of the storage medium locations being accessed, an indicator of a current count of program/erase (PE) cycles of the storage medium or storage medium portion being accessed, an indicator of the word line zone(s) being accessed (e.g., a bottom edge region, middle region or top edge region of a word line) and an indicator of the current temperature of storage medium 130.

In some embodiments, reading threshold voltage update module 329 retrieves a characterization vector based on the one or more storage medium characterization parameter values and prompts storage medium I/O 128 to read from a portion of the storage medium 130 (e.g., via one or more read access commands), such as selectable portion 131 in accordance with the characterization vector. The storage medium I/O 128 reads from the storage medium and provides a sequence of raw read data (or hard-decision read data) to reading threshold voltage update module 329.

Additionally and/or alternatively, during a read operation, reading threshold voltage update module 329 provides one or more updated reading threshold voltages to storage medium I/O 128. Generally, the one or more updated reading threshold voltages are generated based on symbol transition information obtained during normal memory read operations and one or more storage medium characterization parameter values (e.g., a current count of PE cycles and/or a word line zone value) associated with a portion of the storage medium 130. As such, for a portion of the storage medium 130, the one or more updated reading threshold voltages will typically produce more accurate read data than a nominal design value chosen without regard to the symbol transition information obtained during normal memory read operations and the one or more storage medium characterization parameter values. In some implementations, the one or more updated reading threshold voltages are stored in a collection of characterization vectors indexed by one or more storage medium characterization parameter values.

Figure 3A:
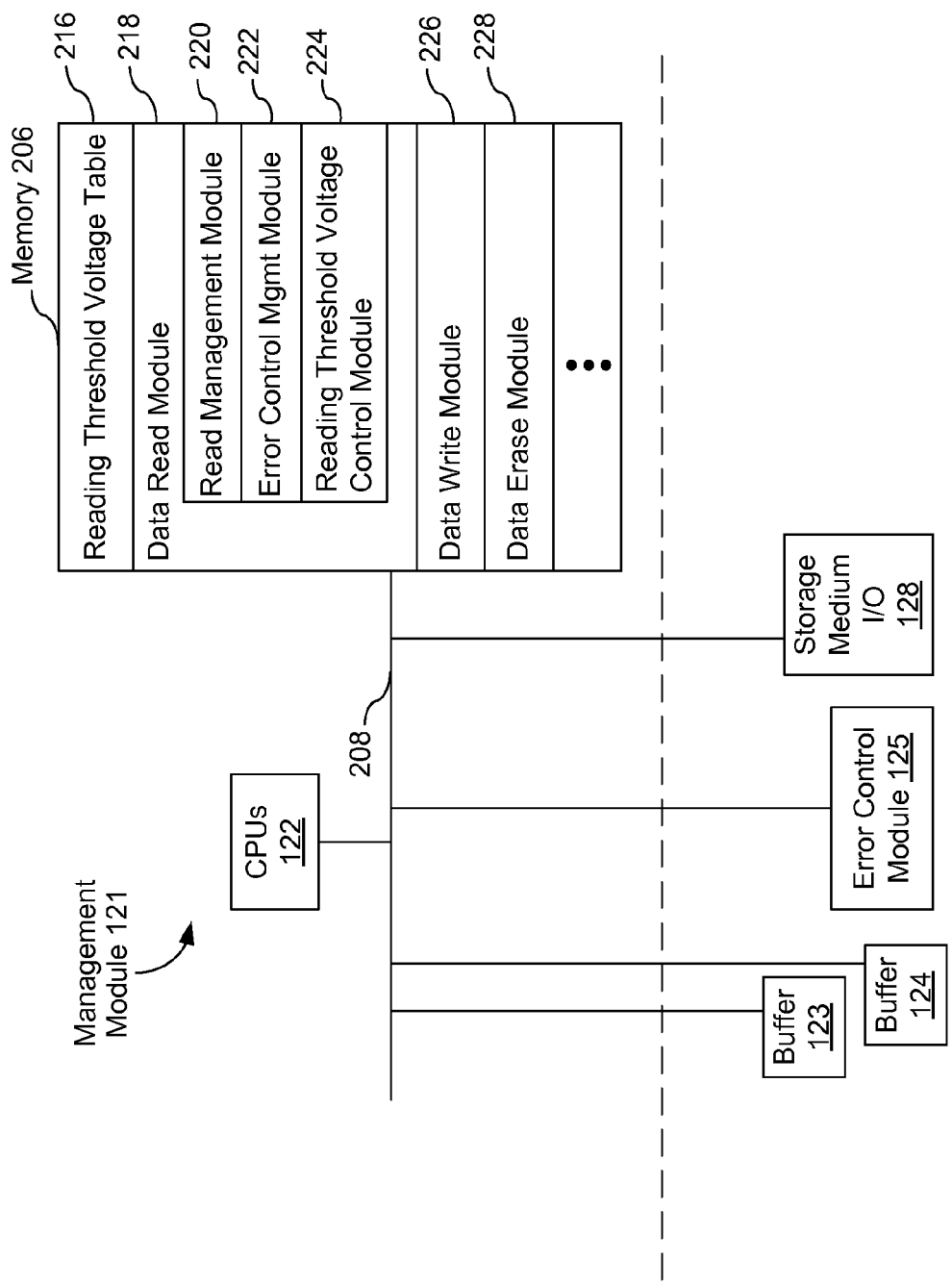
FIG. 3A is a block diagram illustrating an exemplary management module 121, in accordance with some embodiments.

FIG. 3A is a block diagram illustrating an exemplary management module 121, in accordance with some embodiments. Management module 121 typically includes one or more processing units (CPUs) 122 for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. Management module 121 is coupled to buffer 123, buffer 124, error control module 125, and storage medium I/O 128 by communication buses 208. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from the CPU(s) 122. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:

- a reading threshold voltages table 216 that includes a table of reading threshold voltages used for reading symbols from a storage medium;
- a data read module 218 that is used for reading data from a storage medium;
- a data write module 226 that is used for writing data to a storage medium; and
- a data erase module 228 that is used for erasing data from a storage medium.

In some embodiments, the data read module 218 optionally includes the following modules or sub-modules, or a subset thereof:

- a read management module 220 that is used for controlling or managing execution of read commands received from a host device such as computer system 110 (FIG. 1);
- an error control management module 222 that is used to receive error indicators (e.g., syndrome weights) from error control module 125, and optionally to control operation of error control module 125; and
- a reading threshold voltage control module 224 that is used for selecting reading threshold voltages from the reading threshold voltages table 216.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 6 and 7.

Although FIG. 3A shows a management module 121, FIG. 3A is intended more as functional description of the various features which may be present in a management module than as a structural schematic of the embodiments described herein. In practice, and as recognized by those of ordinary skill in the art, items shown separately could be combined and some items could be separated.

Figure 4:
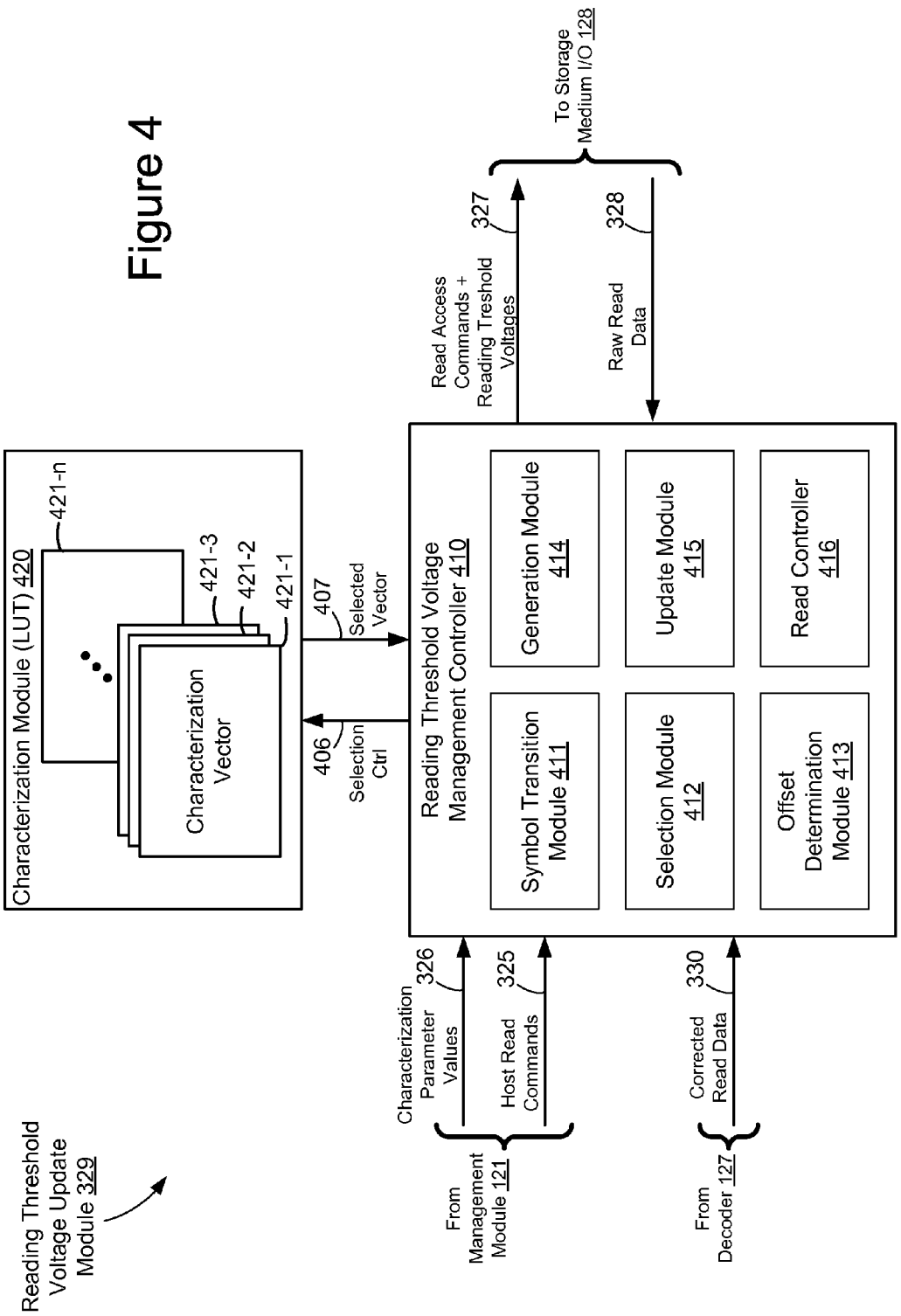
FIG. 4 is a diagram of an implementation of the reading threshold voltage update module included in FIG. 3, in accordance with some embodiments.

FIG. 4 is a diagram of an implementation of reading threshold voltage update module 329 included in FIG. 3. Again, as noted above, while certain specific features are illustrated, those skilled in the art will appreciate from the present disclosure that various other features have not been illustrated for the sake of brevity and so as not to obscure more pertinent aspects of the example implementations disclosed herein. To that end, as a non-limiting example, reading threshold voltage update module 329 includes a characterization module 420 and a reading threshold voltage management controller 410, which includes a symbol transition module 411, a selection module 412, an offset determination module 413, a generation module 414, an update module 415 and a read controller 416. As shown in FIG. 3, reading threshold voltage update module 329 is coupled to management module 121, error control module 125 and storage medium I/O 128.

In some implementations, reading threshold voltage management controller 410 is coupled to receive one or more commands on control line 325 and one or more storage medium characterization parameter values on data line 326. Reading threshold voltage management controller 410 is further coupled to provide reading threshold voltages values to storage medium I/O 128 via line 327. In some implementations, read access commands are also conveyed via line 327 from reading threshold voltage management controller 410 to storage medium 130 via storage medium I/O 128. Alternatively, reading threshold voltage management controller 410 is coupled to provide reading threshold voltages values to management module 121, which then provides the reading threshold voltages values, and read access commands, to storage medium I/O 128, which conveys them in turn to storage medium 130.

In some implementations, reading threshold voltage management controller 410 is further coupled to receive raw read data from storage medium I/O 128 via data line 328. Reading threshold voltage management controller 410 is also coupled to provide characterization module 420 a selection control signal on control line 406 and to receive a selected characterization vector on data line 407. In some implementations, reading threshold voltage management controller 410 is also coupled to receive corrected read data on data line 330.

Characterization module 420 includes a collection of characterization vectors 421, that each store characterization data, such as symbol transition information for bit-tuples (e.g., soft information values, including transition probabilities and/or log-likelihood ratios (LLRs)) and one or more reading threshold voltage values, associated with a portion of storage medium 130 (e.g., a die, block zone, block, or word line portion of storage medium 130). In some embodiments, in the collection of characterization vectors 421, each vector 421 stores characterization data derived at each of at least two time periods (e.g., time T-1 and time T-2, or X program-erase (PE) cycles and 2X PE cycles). In some implementations, the characterization data stored in the characterization vectors 421 is statistically derived. In some implementations, the characterization data further includes storage medium characterization parameter values, such as a current count of program-erase cycles associated with a portion of the storage medium 130 and a word line zone value associated with a portion of storage medium 130. For example, without limitation, in some embodiments in which storage medium 130 includes multiple die, characterization module 420 includes at least one characterization vector for each distinct die. In another example, in some embodiments, characterization module 420 includes a set of distinct characterization vectors 421 for each die in storage medium 130, and the set of distinct characterization vectors 421 for each die includes at least one distinct characterization vector for each block, or each block zone of a plurality of block zones, in the die. More detailed example implementations of characterization vectors 421 are described below with reference to FIGS. 5B and 6B.

In response to one or more host read commands (e.g., at time T-1), memory controller 120 reads data (e.g., raw read data or hard decision read data) from flash memory cells in a flash memory device in accordance with the one or more host read commands (e.g., including one or more characterization parameter values) and a current value of a reading threshold voltage (e.g., generated at time T-2 and stored as a component of a characterization vector 421 associated with a portion of storage medium 130). Reading threshold voltage management controller 410 receives (or alternatively retrieves) the raw read data via data line 328 from storage medium I/O 128.

Symbol transition module 411 obtains symbol transition information corresponding to symbol read errors identified while reading data from the flash memory cells in the flash memory device in response to the one or more host read commands, and in accordance with the current value of the reading threshold voltage (e.g., current value of the reading threshold voltage was generated at time T-2). In some embodiments, symbol transition information is obtained after X PE cycles (e.g., X=500) for a distinct portion of the storage medium. In some embodiments, obtaining the symbol transition information includes detecting/identifying symbol read errors in the data (sometimes called raw read data or hard-decision data) read in response to one or more first host read commands and converting the symbol transition information into soft information (e.g., transition probabilities or LLRs). In some implementations, detecting or identifying symbol read errors is accomplished by successfully decoding a codeword and determining if the decoded data is different from the hard-decision data. For example, the symbol transition information is converted into transition probabilities and/or LLRs via a characterization process. More detailed example implementations of the characterization process are described below with reference to FIGS. 5A-5B and 6A-6B.

In some embodiments, obtaining symbol transition information includes receiving corrected read data from ECC decoder 127 and corresponding raw read data available at storage medium I/O 128 during normal memory read operations in response to one or more host read commands. For example, the symbol transition information is generated from symbol read errors identified by comparing the corrected read data to the corresponding raw read data. In some embodiments, the read data is collected during a read patrol operation. For example, the read patrol operation runs as a background subroutine, whereby the memory controller issues read commands to read every page (or other selectable data unit) of storage medium 130 every 36 hours as a prophylactic measure to detect and correct errors in storage medium 130.

In some embodiments, obtaining symbol transition information includes obtaining symbol transition information for a set of reference cells in respective codewords of the data read in response to one or more host read commands. For example, the symbol transition information is generated from symbol read errors identified in the set of reference cells in respective codewords of the raw read data available at storage medium I/O 128 during normal memory read operations. In this embodiment, reading threshold voltage management module 410 is not coupled to decoder 127 via data line 330. In this embodiment, reading threshold voltage management module 410, however, includes a page identification module (not shown) which keeps track of reference cells read from corresponding upper and lower pages.

Selection module 412 is configured to use the one or more storage medium characterization parameter values to select a characterization vector from the stored collection of characterization vectors 421. In some implementations, the selection control signal 406 is based on one or more storage medium characterization parameter values and/or an index key associated with a combination of one or more storage medium characterization parameter values that enables characterization module 420 to select a characterization vector based on the one or more storage medium characterization parameter values associated with a portion of storage medium 130.

Offset determination module 413 determines a reading threshold voltage offset based at least on: a) a plurality of probability values determined from the symbol transition information (e.g., generated by symbol transition module 411 via a characterization process); b) a current count of program-erase cycles (e.g., a characterization parameter value); and c) a word line zone value (e.g., a perturbation factor) for a word line zone containing the read flash memory cells (e.g., a characterization parameter value). For example, the reading threshold voltage offset satisfies equation (1) sometimes called the reading threshold voltage offset algorithm:

$$\Delta V_{RB}{}^{T-1} = \pm\{a^*(\text{STIR})^x + b^*(\text{PE})^y + c^*(\text{wl})^z\} \quad (1).$$

In equation (1), $\Delta V_{RB}{}^{T-1}$ represents the reading threshold voltage offset for $V_{RB}$ generated at time T-1. For example, $V_{RB}$ is the reading threshold voltage between voltage ranges 212 and 213 for a single lower page read of an MLC memory cell as shown in FIG. 2B. The ± corresponds to the prevalent error direction. Constants a, b, and c are scaling functions, each having a value based on the storage medium characterization parameter values. Exponents x, y and z are scaling values based on storage medium characterization parameter values. Furthermore, in equation (1), STIR is the symbol transition information ratio (e.g., based on transition probabilities shown in table 500 of FIG. 5A); PE is a function based on a current count of program-erase (PE) cycles for a portion of the storage medium; and wl is a function based on a word line zone value corresponding to the read memory cells.

In this example, the $$STIR = \frac{p10_{T-1}}{p01_{T-1}},$$

where the STIR is based on the transition probabilities of $V_{RB}$ for a single lower page read of an MLC memory cell at time T-1. For example, $p10_{T-1}$ is the probability that a "1" is read at time T-1 when a "0" was written, and $p01_{T-1}$ is the probability that a "0" is read at time T-1 when a "1" was written. More detailed example implementations of transition probabilities are described below with reference to FIGS. 5A and 6A. In this example, if the STIR>1, $\Delta V_{RB}^{T-1}$ will shift $V_{RB}$ towards $V_{SS}$. But, if the STIR<1, $\Delta V_{RB}^{T-1}$ will shift $V_{RB}$ towards $V_{DD}$. Furthermore, in some embodiments, the result of equation (1) is bounded so that, for example, $\Delta V_{RB}^{T-1}$ is replaced by $\Delta V_{RB}^{T-1}$ if $|\Delta V_{RB}^{T-1}|>100$ mV. In some other embodiments, if $|\Delta V_{RB}^{T-1}|>100$ mV, $\Delta V_{RB}^{T-1}$ is replaced by a default value, such as 50 mV.

In some embodiments, offset determination module 414 determines a plurality of reading threshold voltage offsets for an MLC memory cell. For example, offset determination module 414 determines a reading threshold voltage offset for each of $V_{RA}$, $V_{RB}$ and $V_{RC}$ for a corresponding MLC memory cell. Those skilled in the art will appreciate from the present disclosure how to apply equation (1) to a joint-page read of an MLC memory device.

In some embodiments, the first factor is based on a ratio of a first set of probability values (e.g., $$\left(e.g., \frac{p10_{T-1}}{p01_{T-1}}\right)$$

determined from a first set of symbol transition information to a second set of a probability values (e.g., $$\left(e.g., \frac{p10_{T-2}}{p01_{T-2}}\right)$$

determined from a second set of symbol transition information, where the second set of symbol transition information was generated at time T-2 and the first set of symbol transition information is generated at time T-1. For this embodiment, the $$STIR = \frac{p10_{T-1} * p01_{T-2}}{p01_{T-1} * p10_{T-2}}.$$

In some embodiments, the second factor is based on a cumulative count of program-erase cycles for the flash memory device or a predefined portion of the flash memory device (e.g., a corresponding die, block zone, block or word line portion of the storage medium).

Generation module 414 generates an updated reading threshold voltage for corresponding memory cells in accordance with the reading threshold voltage offset and the current value of the reading threshold voltage. For example, the updated reading threshold voltage satisfies equation (2) sometimes called the updated reading threshold voltage algorithm:

$$V_{RB}^{T-1} = V_{RB}^{T-2} + \Delta V_{RB}^{T-1} \quad (2).$$

In equation (2), $V_{RB}^{T-1}$ represents the updated reading threshold voltage at time T-1, $V_{RB}^{T-2}$ represents the current value of the reading threshold voltage that was generated at time T-2 and $\Delta V_{RB}^{T-1}$ represents the reading threshold voltage offset at time T-1.

Update module 415 updates a look-up table (LUT) shown in FIGS. 7A-7B with one or more reading threshold voltage offsets and/or one or more updated reading threshold voltages associated with a portion of the storage medium. In some embodiments, entries of the LUT are stored as components of characterization vectors 421 associated with a portion of the storage medium.

Read controller 416 is configured to read a portion of storage medium 130 via storage medium I/O 128. In some implementations, the read controller 416 is configured to provide storage medium I/O 128 with one or more read access commands and one or more reading threshold voltages (e.g., including one or more reading updated threshold voltages) for a read operation. In some implementations, read controller 416 selects one or more updated reading threshold voltages from characterization vectors 421 based on the one or more storage medium characterization parameter values associated with storage medium 130 or the current state of storage medium 130.

Symbol transition module 411 is further configured to generate a sequence of symbol transition information (e.g., soft information values, including either transition probabilities or LLRs) corresponding to hard-decision read data. More specifically, in some implementations, symbol transition module 411 assigns at least one soft information value, in the form of an LLR, to each bit-tuple in the hard-decision read data from the read operation to produce a sequence of LLRs $y_{LLR} = (y_0, y_1, \ldots, y_{n-1})$, where n is the codeword length.

In some implementations, LLRs can be generated from transition probabilities. To that end, a basis for a characterization process may be established as follows. Let X be the set of $Q=2^q$ levels on which a q-bit bit-tuple is written to a flash memory cell, where each of the q-bits is from a respective one of q-pages. For example, when $$q = 2, X = \{11, 01, 00, 10\}.$$

Let Y be the set of Q levels that a q-bit bit-tuple is read out from the flash memory cell based on reading threshold voltages, such as $V_{RA}$, $V_{RB}$ and $V_{RC}$ described above with reference to FIG. 2B. Due to pseudo-random fluctuations, defects in the storage medium, operating conditions, device history, and/or write-read circuitry, etc., the read out voltage level from a flash memory cell $y \in Y$ may be different from the written voltage level $x \in X$. The set of actual voltages for each level in memory cell typically has a distribution or set of possible values, as described above with reference to FIG. 2B. The voltage distributions are affected by factors such as page location, page type, program/erase (PE) cycles, data mode (operation, retention), temperature, etc. In some implementations, the voltage distribution and the variation of the voltage distribution may be used to generate soft information values, such as transition probabilities and/or LLRs, based on a device characterization process.

The following describes an example in which q=2 (i.e., 2 bits per cell in an MLC flash memory). However, those skilled in the art will appreciate from the present disclosure that the 2-bit implementation may be extended to other types of MLC flash memory that more bits (q≥3) per memory cell.

Each combination of storage medium characterization parameter values represents a respective state of a storage medium (e.g., a flash memory device) that may be characterized in a device characterization process, and may exist for other devices produced by the same manufacturing process.

With respect to MLC flash memory (e.g., storage media 130), there are generally two types of read operations that may be performed on MLC flash memory that result in disjoint sets of transition probabilities. One is a single-page read, which includes reading the respective bits of a particular page from a number of q-page MLC flash memory cells. For example, for a 2-page flash memory, the two constituent pages are referred to as the lower page and the upper page, where the lower page bit is typically the least significant bit of the 2-bit bit-tuple, and the upper page is the most significant bit. For the single-page read scenario, one of the upper page and lower page bit from a number of MLC flash memory cells is read. Thus, a lower-page read delivers a sequence of respective lower-page bits from a number of 2-page MLC flash memory cells. The other type of read is a joint-page read, which generally includes reading the respective bits of two or more pages from a number of q-page MLC flash memory cells. So, for a 2-page (i.e., q=2) flash memory, a joint-page read delivers a sequence of respective 2-bit bit-tuples from a number of 2-page MLC flash memory cells. For each type of read, and a combination of storage medium characterization parameter values, one or more transition probabilities tables is generated by comparing write data and read data.

Figures 5A, 5B:
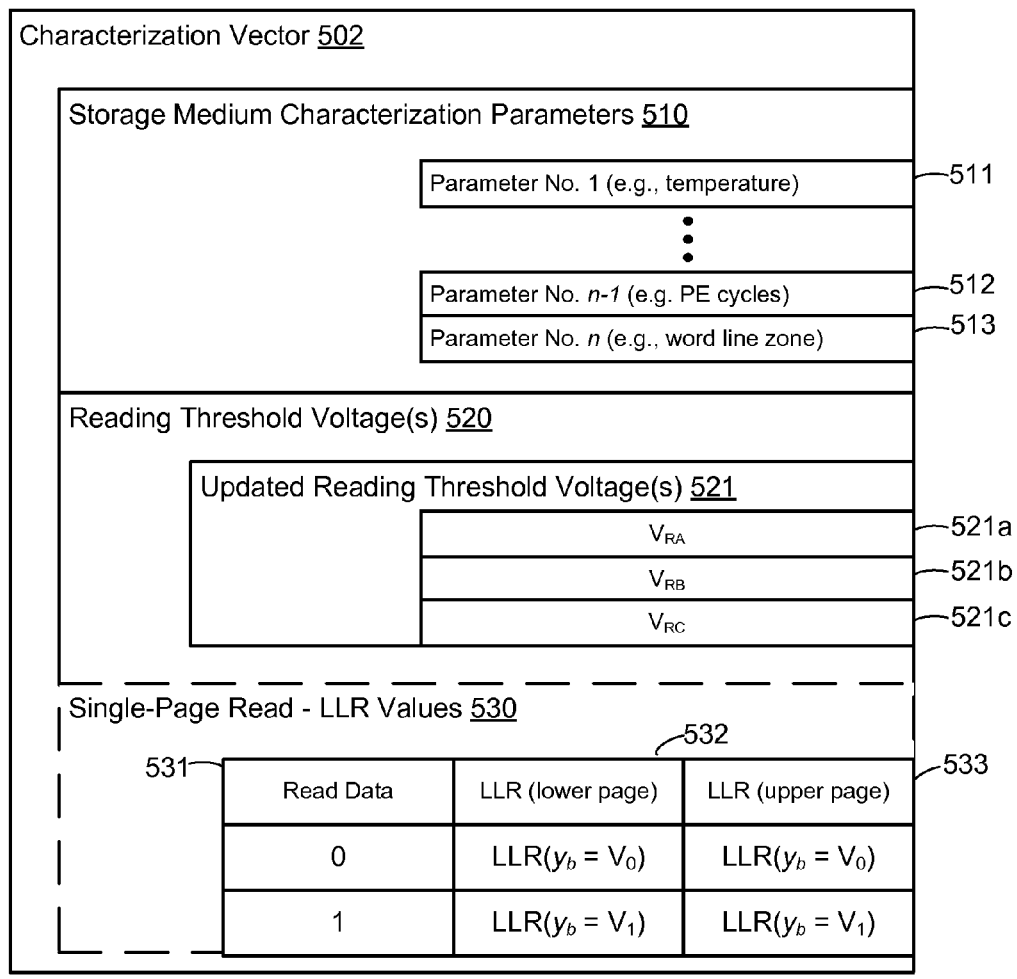
FIG. 5A is a transition probability table that may be associated with either a single-level memory cell or a single-page read of a multi-level memory cell, in accordance with some embodiments.
FIG. 5B is a schematic diagram of an implementation of a characterization vector that may be produced from the transition probability table of FIG. 5A, in accordance with some embodiments.

FIG. 5A, for example, is a transition probability table 500 associated with either an SLC flash memory cell or a single-page read of an MLC flash memory cell for a particular combination of storage medium characterization parameter values. The transition probability values $p_{00}, p_{10}, p_{01}, p_{11}$ in transition probability table 500 are determined for a single-page read of an MLC flash memory cell as follows. Let $x_b$ be the data bit written to a lower page and $y_b$ be the voltage level range read from the same lower page. Each transition probability $p_{00}, p_{10}, p_{01}, p_{11}$ is determined as a conditional probability $$p_{i,j} = p(y_b = V_j | x_b = i)$$

that a particular voltage level range $y_b = V_j$ is read when the bit $x_b = i$ was written. For example, the transition probability $p_{00}$ is the probability that a voltage level range $V_0$ was read given a bit "0" was written, and the transition probability $p_{01}$ is the probability that a voltage level range $V_1$ was read given that a bit "0" was written, etc. Moreover, the transition probabilities, and subsequently the LLRs, generated for the single-page read correspond to bit-tuples each including a single bit even though the MLC flash memory cell stores a bit-tuple including two or more bits. Those skilled in the art will appreciate from the present disclosure that the transition probability table for the upper page is similarly obtained by writing and reading upper page data for a combination of storage medium characterization parameter values. Those skilled in the art will also appreciate from the present disclosure that for each of the possible write bit values, the transition probabilities satisfy equation (3):

$$\Sigma_{j=0}^{2q-1}(p_{ij})=1 \quad (3).$$

Once the transition probabilities have been generated for a combination of storage medium characterization parameter values, corresponding LLRs may be generated and stored in a collection of characterization vectors. In some implementations, the transition probabilities are stored in a collection of characterization vectors instead of, or in addition to, the LLRs. However, LLRs provide a more compact representation of the soft information provided by the transition probabilities.

Figures 6A, 6B:
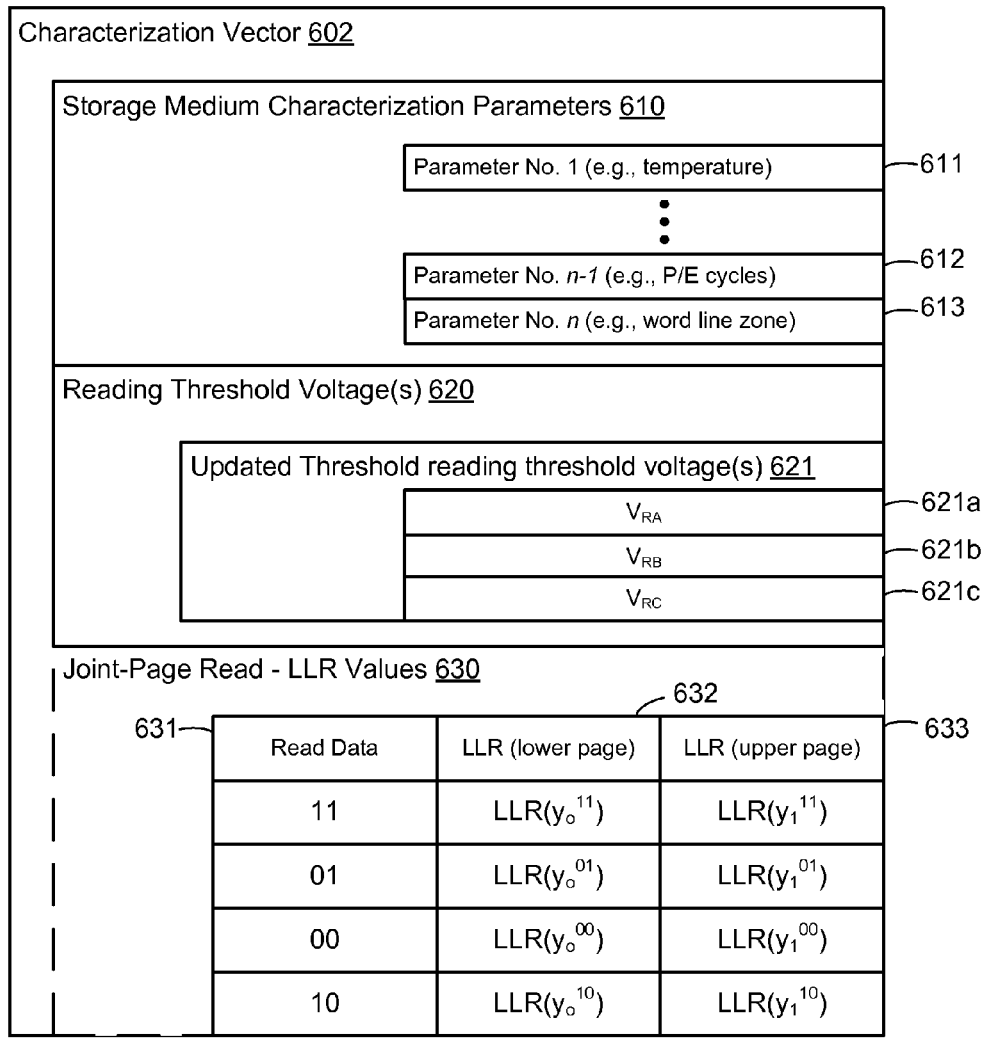
FIG. 6A is a transition probability table that may be associated with a joint-page read of a multi-level memory cell, in accordance with some embodiments.
FIG. 6B is a schematic diagram of an implementation of a characterization vector that may be produced from the transition probability table of FIG. 6A, in accordance with some embodiments.

FIG. 6A is a transition probability table 600 associated with a joint-page read of an MLC flash memory cell. Again, a joint-page read generally includes reading the respective bits of two or more pages from a number of q-page MLC flash memory cells. Consequently, the sequence of read data includes multi-bit bit-tuples, and the transition probabilities and LLRs generated for a joint-page read correspond to bit-tuples each including two or more bits. Accordingly, for a 2-page MLC flash memory the bits for both the upper page and lower page are read together (e.g., by determining the voltage level produced by a 2-bit flash memory cell during a read operation). Again, the characterization process includes comparing the read out voltage level range y∈Y with the written data x∈X, and the transition probability $p_{i,j}=p(y=j|x=i)$ is the conditional probability of read out voltage level range y=j given the written data x=i. Additionally, for the joint-page read the written data and read voltage level ranges {11,01,00,10} are mapped to a respective index {3,1,0,2} in the table. Thus, for example, the transition probability $p_{13}$ is the probability that voltage level range $V_{11}$ (or $V_3$) is read (i.e., that a memory cell voltage in the voltage level range associated with a "3" is read) when a "1" (or "01") was written. Further, as described above, for each data value written to the MLC flash memory cell, the transition probabilities satisfy equation (3).

In some implementations, LLRs for a combination of storage medium characterization parameter values may be generated using equation (4) as follows:

$$LLR(y_k) \equiv \log\left(\frac{P(x_k = 0 | y)}{P(x_k = 1 | y)}\right). \quad (4)$$

In equation (4), $y_k$ represents the k-th bit read from a q-bit multi-level memory cell, which corresponds to a read out voltage level range y∈Y for 0≤k<q. Equation (4) can be rewritten as (4a), in which $X_k^{(0)}$ denotes the subset of the written bits X where the k-th bit is 0, $X_k^{(1)}$ denotes the subset of the written bits X where the k-th bit is 1, and $X_k^{(0)} \cup X_k^{(1)} = X$.

$$LLR(y_k) = \log\left(\frac{\sum_{\alpha \in X_k^{(0)}} P(y | x = \alpha)}{\sum_{\alpha \in X_k^{(1)}} P(y | x = \alpha)}\right) \quad (4a)$$

For a single-page read, equation (4a) simplifies to equations (5) and (6):

$$LLR(V_0) = \log\left(\frac{P(y_b = V_0 | x_b = 0)}{P(y_b = V_0 | x_b = 1)}\right) = \log\left(\frac{p_{00}}{p_{10}}\right) \quad (5)$$

-continued $$LLR(V_1) = \log\left(\frac{P(y_b = V_1 \mid x_b = 0)}{P(y_b = V_1 \mid x_b = 1)}\right) = \log\left(\frac{p_{01}}{p_{11}}\right) \quad (6)$$

For a joint-page read, equation (2a) does not simplify as concisely as above for $y_b=V_0$ and $y_b=V_1$. However, as an example for $y=V_{11}$, equation (2a) may be written as:

$$LLR(V_{11}, \text{upper page}) = \log\left(\frac{P(y = V_{11} \mid x = 00) + P(y = V_{11} \mid x = 10)}{P(y = V_{11} \mid x = 11) + P(y = V_{11} \mid x = 01)}\right) \quad (7)$$

$$LLR(V_{11}, \text{lower page}) = \log\left(\frac{P(y = V_{11} \mid x = 01) + P(y = V_{11} \mid x = 00)}{P(y = V_{11} \mid x = 11) + P(y = V_{11} \mid x = 10)}\right) \quad (8)$$

Those skilled in the art will appreciate from the present disclosure, and in particular equations (4a), (7) and (8), how to obtain the LLRs for $y=V_{01}$, $V_{00}$ and $V_{10}$.

FIG. 5B is a schematic diagram of an implementation of a characterization vector 502 (e.g., corresponding to any one of the characterization vectors 421 shown in FIG. 4); in some implementations, characterization vector 421 includes soft information values 532, 533 produced from transition probability values in table 500 of FIG. 5A. In some implementations, characterization vector 502 includes a storage medium characterization parameters field 510, a reading threshold voltages field 520, and a single-page read LLR values field 530. With further reference to FIGS. 3 and 4, in some implementations, a characterization vector is a data structure that facilitates reading raw data values from a storage medium. In some implementations, respective transition probability values (e.g., based on transition probability table 500) and/or LLR values (e.g., LLR($y_b=V_0$) and LLR($y_b=V_1$)) for a single-page read and/or a joint-page read are stored in a respective characterization vector for a combination of storage medium characterization parameter values for a portion of a storage medium. In some embodiments, memory controller 120, or a reading threshold voltage update module 329 of the memory controller, generates an updated reading threshold voltage based at least on a respective transition probability or LLR value and one or more storage medium characterization parameter values associated with a portion of the storage medium.

Storage medium characterization parameters field 510 is provided to store one or more storage medium characterization parameter values. For example, the storage medium characterization parameters field 510 includes a temperature field 511, a program-erase (PE) cycles field 512 and a word line zone field 513. However, those skilled in the art will appreciate from the present disclosure that any number of storage medium characterization parameter values (e.g., those discussed above) may be included in the storage medium characterization parameters field 510. The storage medium characterization parameter values in field 510 correspond to a state of a portion of the storage medium for which the characterization data in characterization vector 502 is applicable. As such, in some implementations, a collection of characterization vectors may be indexed, and thus made searchable and selectable, by one or more storage medium characterization parameter values stored in the respective fields.

In some implementations, characterization vector 502 does not include storage medium characterization parameters field 510, and instead the storage medium characterization parameter values corresponding to characterization vector 502 are implied by the location of characterization vector 502 in a table or database of characterization vectors. For example, if there are three storage medium characterization parameters (a, b and c), having, 3, 4 and 5 potential values, respectively, there will a set of 60 (i.e., 3×4×5) distinct characterization vectors for 60 distinct states of the storage medium. Any one of the 60 characterization vectors is accessed by forming an index from the three storage medium characterization parameters (a, b and c) corresponding to the current state of the storage medium, and reading or otherwise obtaining the characterization vector corresponding to that index.

Reading threshold voltage(s) field 520 is provided to store one or more reading threshold voltages applicable to a respective state of a storage medium characterized by the one or more storage medium characterization parameter values used to define characterization vector 502. In some implementations, reading threshold voltage(s) field 520 includes one or more default reading threshold voltages for memory cells produced by a particular manufacturing process, one or more reading threshold voltage offsets associated with a portion of the storage medium and/or one or more updated reading threshold voltages associated with a portion of the storage medium. In some embodiments, reading threshold voltage(s) field 520 includes an updated reading threshold voltages field 521, which includes $V_{RA}$ 521a, $V_{RB}$ 521b and $V_{RC}$ 521c. For example, if $V_{RA}$ 521a, $V_{RB}$ 521b and $V_{RC}$ 521c were determined at time T-1, then during a subsequent read operation at time T one or more of $V_{RA}$ 521a, $V_{RB}$ 521b and $V_{RC}$ 521c is used to read a corresponding portion of the storage medium.

The single-page read LLR values field 530 stores lower page LLR values 532 and upper page LLR values 533 for respective lower and upper page reads, which are indexed by read data values 531 (e.g., "0" and "1").

FIG. 6B is a schematic diagram of an implementation of a characterization vector 602 (e.g., corresponding to any one of the characterization vectors 421 shown in FIG. 4); in some implementations, characterization vector 602 includes soft information values 632, 633 produced from the transition probability values in table 600 of FIG. 6A. The characterization vector 602 illustrated in FIG. 6B is similar to characterization vector 502 illustrated in FIG. 5B. Elements common to both characterization vectors have been assigned the same reference numbers, and only the differences between the characterization vectors 502 and 602 are described herein for the sake of brevity. Moreover, while certain specific features are illustrated, those skilled in the art will appreciate from the present disclosure that various other features have not been illustrated for the sake of brevity and so as not to obscure more pertinent aspects of the example implementations disclosed herein. As compared to characterization vector 502, characterization vector 602 includes a joint-page read LLR value field 630 that stores lower page LLR values 632 and upper page LLR values 633 for respective lower and upper page reads, which are indexed by read data values 631.

FIG. 7A is a diagram of a look-up table (LUT) comprising reading threshold voltage offsets. In some embodiments, the entries of LUT 700a are stored as a characterization data value included in characterization vectors 421 associated with a portion of the storage medium. For example, the entries of LUT 700a are stored as a characterization data value in reading threshold voltage(s) field 520 (or 620) of characterization vector 502 (or 602). In some embodiments, reading threshold voltage update module 329 (a component of memory controller 120) determines a reading threshold voltage offset every X program-erase (PE) cycles. For example, X is an integer having a value no less than 500. In this example, reading threshold voltage update module 329 determines a reading threshold voltage offset every 500 PE cycles. In some embodiments, X is based on a cumulative count of PE cycles for the flash memory device or a predefined portion of the flash memory device (e.g., a corresponding die, block zone, block or word line portion of the flash memory device).

FIG. 7A shows LUT 700a with entries corresponding to default reading threshold voltages α, β and γ in row 720 for memory cells produced by a particular manufacturing process. FIG. 7A further shows LUT 700a with entries corresponding to reading threshold voltage offsets ΔA, ΔB, ΔC determined every X PE cycles for each of $V_{RA}$, $V_{RB}$, $V_{RC}$ (in columns 730, 740, 750, respectively). FIG. 7A corresponds to a memory device consisting of 2 bit MLC memory cells. Those skilled in the art will appreciate from the present disclosure how to tailor the LUT for a memory device consisting of SLC memory cells or q-bit MLC memory cells, where q>2.

FIG. 7B is a diagram of a look-up table (LUT) comprising reading threshold voltage offsets for each of a plurality of world line zones. LUT 700b illustrated in FIG. 7B is similar to LUT 700a illustrated in FIG. 7A. Elements common to both LUTs have been assigned the same reference numbers, and only the differences between LUTs 700a and 700b are described herein for the sake of brevity.

FIG. 7B shows LUT 700b with entries corresponding to default reading threshold voltages in row 720 for memory cells produced by a particular manufacturing process for each of three word line zones (e.g., wl1, wl2, wl3). For example, row 720 of LUT 700b comprises default reading threshold voltages (e.g., α(wl1), α(wl2), α(wl3)) corresponding to $V_{RA}$ for each of the three word line zones. FIG. 7B further shows LUT 700b with entries corresponding to reading threshold voltage offsets ΔA, ΔB, ΔC determined every X PE cycles for each of $V_{RA}$, $V_{RB}$, $V_{RC}$ for each of three word line zones. For example, columns 730a, 730b, 730c comprise reading threshold voltage offsets (e.g., ΔA(wl1), ΔA(wl2), ΔA(wl3)) determined every X PE cycles for $V_{RA}$ for each of three word line zones. In some embodiments, the three word line zones correspond to a top edge region, a middle region and a bottom edge region of a word line of a flash memory device. In some embodiments, the plurality of word line zones equals a number greater than three.

Figure 8A:
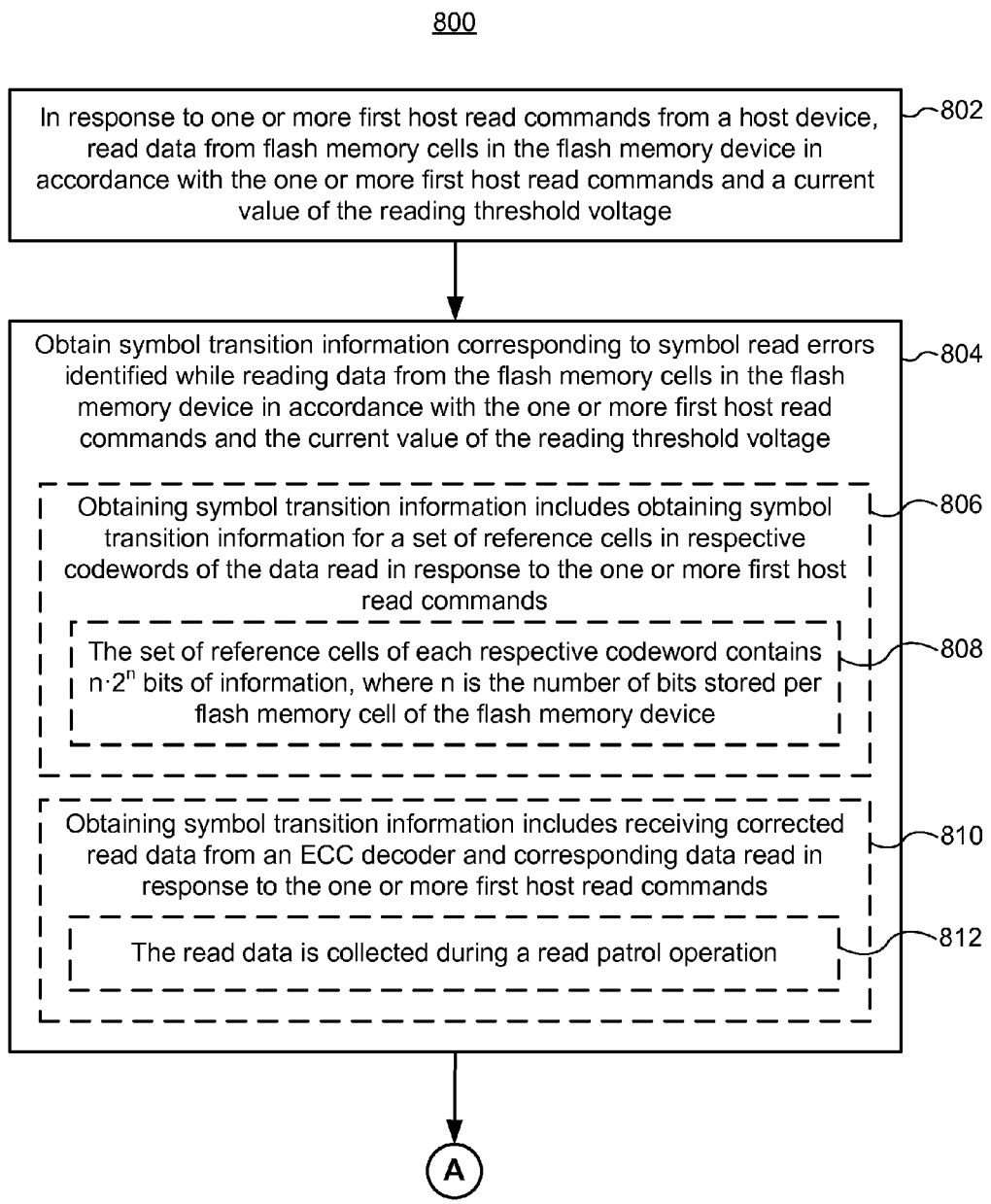
FIG. 8A-8C illustrate a flowchart representation of a method for updating a reading threshold voltage, in accordance with some embodiments.
Figure 8B:
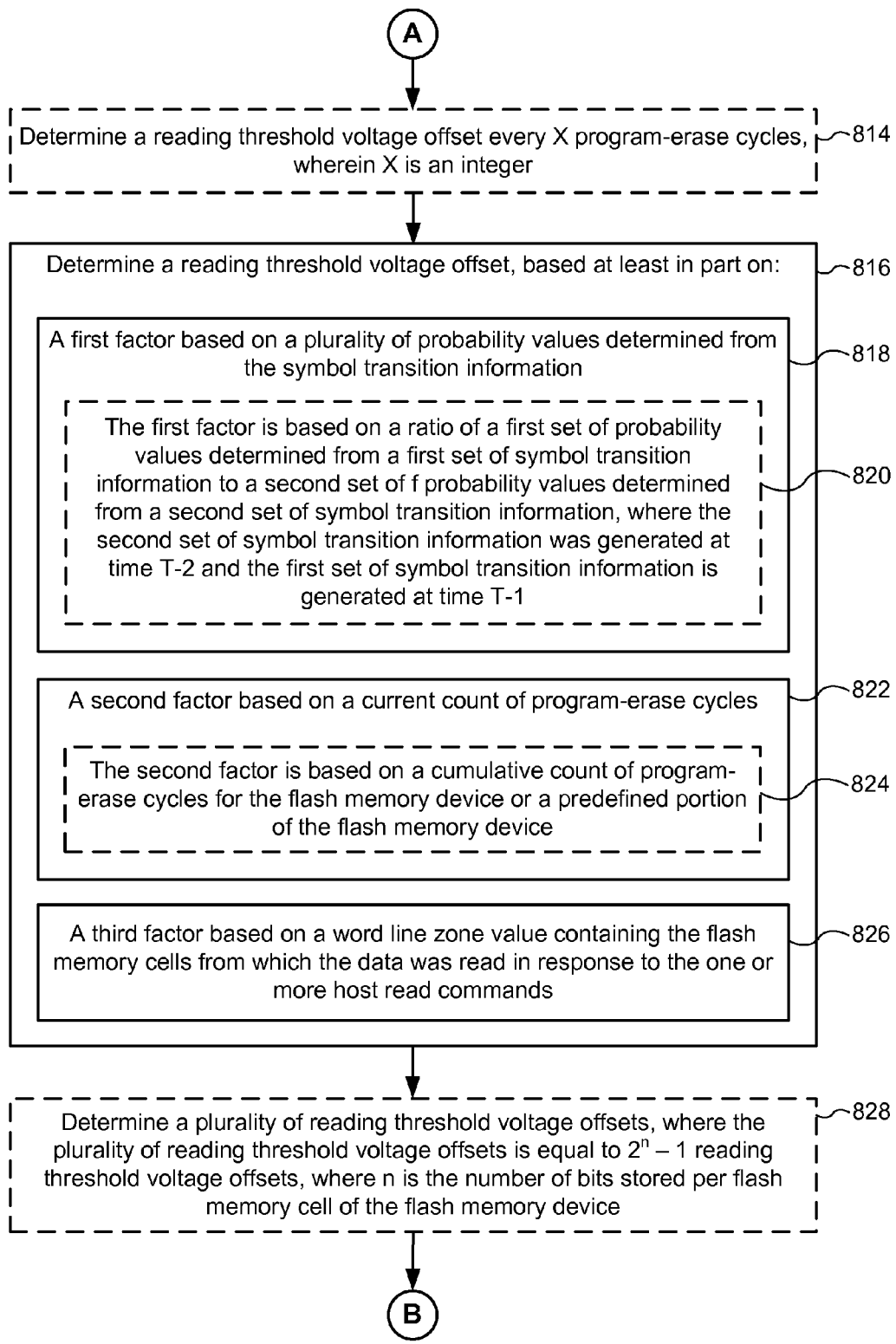
Figure 8C:
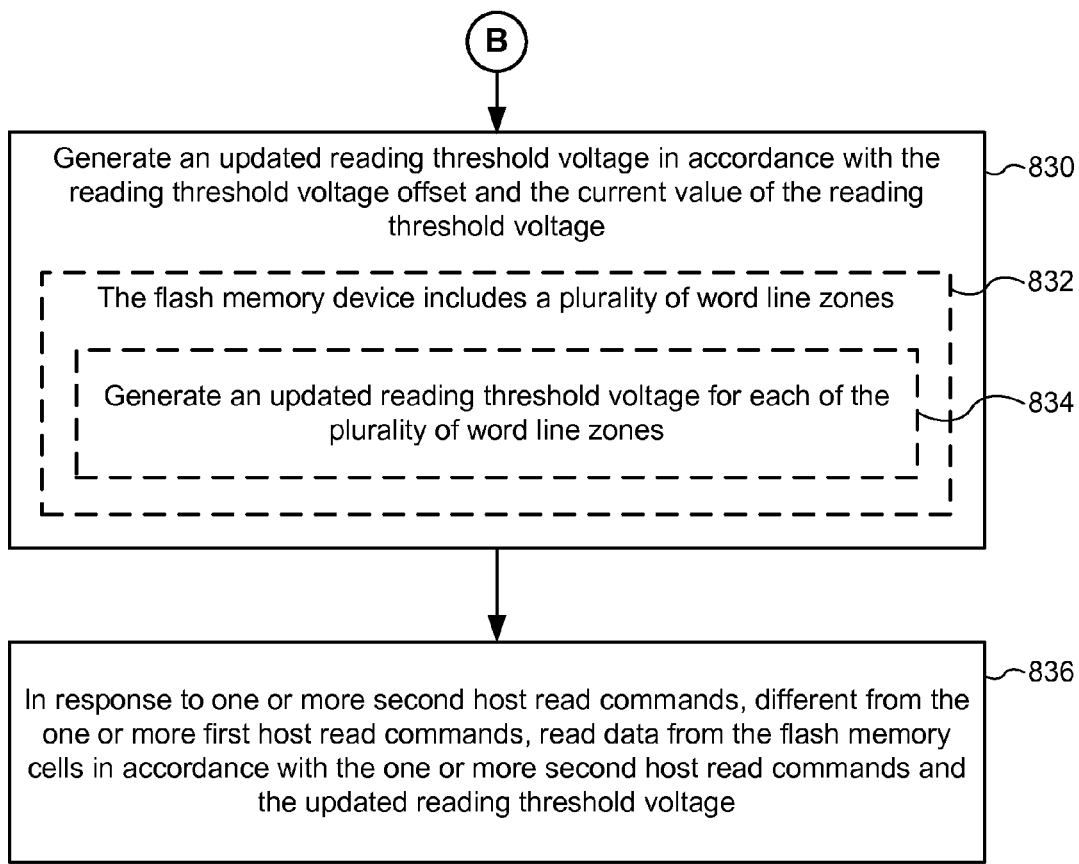

FIGS. 8A-8C illustrate a flowchart representation of a method 800 for updating a reading threshold voltage used for reading symbols from a flash memory device, based at least in part on symbol transition information obtained during normal memory read operations. In some implementations, method 800 is performed by a memory controller (e.g., memory controller 120) or a component of the memory controller (e.g., reading threshold voltage update module 329). In some embodiments, method 800 is governed by instructions that are stored in a computer readable storage medium and that are executed by one or more processors of a device, such as the one or more processing units (CPUs) 122 of management module 121, shown in FIGS. 1 and 3.

In response to one or more first host read commands received from a host device, a memory controller reads (802) data from flash memory cells in a flash memory device in accordance with the one or more first host read commands and a current value of the reading threshold voltage. FIG. 3, for example, shows memory controller 120 (e.g., a flash memory controller) configured to receive one or more first host read commands via control line 111 from computer system 110 (e.g., a host device) corresponding to a selectable portion of storage medium 130. In this example, reading threshold voltage update module 329 (a component of flash memory controller 120) issues one or more first read access commands via storage medium I/O 128, in response to the one or more first host read commands, to read data from corresponding flash memory cells in a flash memory device (e.g., storage medium 130). Reading threshold voltage update module 329 issues the one or more first read access commands in accordance with a current value of reading threshold voltage (e.g., stored as a characterization data value of a characterization vector 421) and one or more storage medium characterization parameter values via line 327 to read the corresponding portion of storage medium 130.

The memory controller obtains (804) symbol transition information corresponding to symbol read errors identified while reading data from the flash memory cells in the flash memory device in accordance with the one or more first host read commands and the current value of the reading threshold voltage. FIG. 4, for example, shows symbol transition module 411 configured to obtain symbol transition information from hard-decision data (sometimes called raw read data) retrieved (or alternatively, received) from storage medium I/O 128 via data line 328.

In some embodiments, obtaining the symbol transition information includes (806) obtaining symbol transition information for a set of reference cells in respective codewords of the data read in response to the one or more first host read commands. FIG. 4, for example, shows symbol transition module 411 configured to obtain symbol transition information for a set of reference cells in respective codewords of raw read data received from storage medium I/O 128 via data line 328. In some embodiments, the set of reference cells of each respective codeword contains (808) n·$2^n$ bits of information, where n is the number of bits stored per flash memory cell of the flash memory device. For example, each reference cell of a respective codeword contains 8 bits of information if the respective codewords were read from a memory device consisting of 2 bit MLC memory cells.

In some embodiments, obtaining symbol transition information includes (810) receiving corrected read data from an ECC decoder and corresponding the data read in response to the one or more first host read commands. FIG. 4, for example, shows symbol transition module 411 configured to obtain symbol transition information by receiving corrected read data from decoder 127 and corresponding raw read data from storage medium I/O 128. In some embodiments, the read data is collected (812) during a read patrol operation.

In some embodiments, the memory controller determines (814) a reading threshold voltage offset every X program-erase (PE) cycles, where X is an integer. FIG. 3, for example, shows management module 121 coupled to provide reading threshold voltage update module 329 one or more characterization parameter values via line 326, including a current count of PE cycles for a portion of storage medium 130. FIG. 4, for example, shows offset determination module 412 (a component of reading threshold voltage update module 329) configured to determine a reading threshold voltage every X PE cycles based on one or more characterization parameter values received from management module 121 via line 326.

The memory controller determines (816) the reading threshold voltage offset, based at least in part on: a) a first factor (818) based on a plurality of probability values determined from the symbol transition information; b) a second factor (822) based on a current count of program-erase cycles; and c) a third factor (826) based on a word line zone value for a word line zone containing the flash memory cells from which the data was read in response to the one or more first host read commands. FIG. 5A, for example, shows a plurality of transition probability values in table 500 determined from the symbol transition information obtained by symbol transition module 311 in FIG. 3 corresponding to a single page read of 2 bit MLC memory cells. FIG. 5B, for example, shows a current count of program-erase (PE) cycles stored as a storage medium characterization parameter value (e.g., parameter no. n−1) of characterization vector 502. FIG. 5B, for example, shows a word line zone value for a word line zone containing corresponding flash memory cells stored as a storage medium characterization parameter value (e.g., parameter no. n) of characterization vector 502.

In some embodiments, the first factor is based (820) on a ratio of a first set of probability values determined from a first set of symbol transition information to a second set of a probability values determined from a second set of symbol transition information, where the second set of symbol transition information was generated at time T-2 and the first set of symbol transition information is generated at time T-1. For example, the first set of symbol transition information is generated by symbol transition module 411 at time T-1 from the data read in response to one or more host read commands. In this example, selection module selects a characterization vector corresponding to one or more storage medium characterization parameter values. The selected characterization vector includes the second set of symbol transition information generated at time T-2. Finally, in this example, offset determination module 413 determines the first factor of the reading threshold voltage offset based on a ratio of the first set of symbol transition information (from symbol transition module 411) to the second set of symbol transition information (from the selected characterization vector 421) in order to implement the first factor in the reading threshold voltage offset algorithm (e.g., equation (1) above).

In some embodiments, the second factor is based (824) on a cumulative count of program-erase (PE) cycles for the flash memory device or a predefined portion of the flash memory device (e.g., a corresponding die, block zone, or block portion of the flash memory device). For example, a separate PE count is stored as storage medium characterization parameter value in a corresponding characterization vector for each flash memory device and/or die of the flash memory device and/or a predefined portion (e.g., quadrant, block zone, block, word line, etc.) of each die.

In some embodiments, the memory controller determines (828) a plurality of reading threshold voltage offsets, where the plurality of reading threshold voltage offsets is equal to $2^n-1$ reading threshold voltage offsets, where n is the number of bits stored per flash memory cell of the flash memory device. For example, a memory controller determines three reading threshold voltage offsets for each of three corresponding reading threshold voltages for a memory device with 2 bit MLC memory cells.

The memory controller generates (830) an updated reading threshold voltage in accordance with the reading threshold voltage offset and the current value of the reading threshold voltage. FIG. 4, for example, shows generation module 414 configured to generate an updated reading threshold voltage in accordance with a reading threshold voltage offset determined by offset determination module 413 and the current value of the reading threshold voltage (e.g., stored as a characterization data value of a characterization vector 421 corresponding to a portion of the storage medium). The updated reading threshold voltage, for example, is generated by generation module 414 according to the updated reading threshold voltage algorithm (e.g., equation (2) above).

In some embodiments, the flash memory device includes (832) a plurality of word line zones. In some implementations, a word line consists of three word line zones, including a top edge region, a middle region and a bottom edge region. In some embodiments, the memory controller generates (834) an updated reading threshold voltage for each of the plurality of word line zones. FIG. 7B, for example, shows a look-up table (LUT) comprising reading threshold voltage offsets for each of three word line zones. For example, generation module 414 is configured to generate at time T-1 updated reading threshold voltages (e.g., $V_{RA}^{T-1}(wl1)$, $V_{RA}^{T-1}(wl2)$, $V_{RA}^{T-1}(wl3)$) for each of the three word line zones in accordance with the reading threshold voltage offsets (e.g., $\Delta A_X(wl1)$, $\Delta A_X(wl2)$, $\Delta A_X(wl3)$ determined after X PE cycles for each of the three word line zones and stored in the LUT shown in FIG. 7B) and the current values of the reading threshold voltages (e.g., stored as a characterization data value of corresponding characterization vectors 421 at time T-2).

In response to one or more second host read commands, different from the one or more first host read commands received from the host device, the memory controller reads (836) data from the flash memory cells in accordance with the one or more second host read commands and the updated reading threshold voltage. FIG. 3, for example, shows reading threshold update module 329 (a component of memory controller 120) configured to provide storage medium I/O 128 with one or more reading threshold voltages via line 327 (e.g., including one or more updated reading threshold voltages). In response to one or more second host read commands, different from the one or more first host read commands received from the host device (e.g., computer system 110), reading threshold voltage update module 329 issues one or more second read access commands via storage medium I/O 128 to read data a portion of storage medium 130. Reading threshold voltage update module 329 issues the one or more second read access commands in accordance with the one or more second host read commands (e.g., including one or more storage medium characterization parameter values which at least include a memory location of the portion of storage medium 130 to be accessed) and the updated reading threshold voltage (e.g., stored as a characterization data value of a characterization vector 421 associated with the portion of the storage medium 130).

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method for updating a reading threshold voltage applied to control gates of memory cells in a flash memory device while reading symbols from the flash memory device, the method comprising:
   in response to one or more first host read commands received from a host device, obtaining symbol transition information corresponding to symbol read errors identified while reading data from flash memory cells in the flash memory device in accordance with the one or more first host read commands and the current value of the reading threshold voltage;
   determining a reading threshold voltage offset, based at least in part on:
      a first factor based on a plurality of probability values determined from the symbol transition information;
      a second factor based on a current count of program-erase cycles; and
      a third factor based on a word line zone value for a word line zone of the flash memory device containing the flash memory cells from which the data was read in response to the one or more first host read commands;
   generating an updated reading threshold voltage, to be applied to the control gates of memory cells in the flash memory device while reading symbols from the flash memory device, in accordance with the reading threshold voltage offset and the current value of the reading threshold voltage; and
   in response to one or more second host read commands, different from the one or more first host read commands received from the host device, reading data from the flash memory cells in accordance with the one or more second host read commands and the updated reading threshold voltage.

2. The method of claim 1, wherein obtaining symbol transition information includes obtaining symbol transition information for a set of reference cells in respective codewords of the data read in response to the one or more first host read commands.

3. The method of claim 2, wherein the set of reference cells of each respective codeword contains $n \cdot 2^n$ bits of information, where n is the number of bits stored per flash memory cell.

4. The method of claim 1, wherein obtaining symbol transition information includes receiving corrected read data from an ECC decoder and corresponding raw data read in response to the one or more first host read commands.

5. The method of claim 4, wherein the read data is collected during a read patrol operation.

6. The method of claim 1, comprising determining the reading threshold voltage offset every X program-erase cycles, wherein X is an integer.

7. The method of claim 1, further comprising determining a plurality of reading threshold voltage offsets, wherein the plurality of reading threshold voltage offsets is equal to $2^n-1$ reading threshold voltage offsets, where n is the number of bits stored per flash memory cell.

8. The method of claim 1, wherein the first factor is based on a ratio of a first set of probability values determined from a first set of symbol transition information to a second set of a probability values determined from a second set of symbol transition information, wherein the second set of symbol transition information was generated at time T-2 and the first set of symbol transition information is generated at time T-1.

9. The method of claim 1, wherein the second factor is based on a cumulative count of program-erase cycles for the flash memory device or a predefined portion of the flash memory device.

10. The method of claim 1, wherein the flash memory device includes a plurality of word line zones.

11. The method of claim 10, comprising generating an updated reading threshold voltage for each of the plurality of word line zones.

12. A controller for updating a reading threshold voltage applied to control gates of memory cells in a flash memory device while reading symbols from the flash memory device, the controller comprising:
   a memory controller with interfaces to the flash memory device and a host, configured to:
      in response to one or more first host read commands received from a host device, obtain symbol transition information corresponding to symbol read errors identified while reading data from flash memory cells in the flash memory device in accordance with the one or more first host read commands and the current value of the reading threshold voltage;
      determine a reading threshold voltage offset, based at least in part on:
         a first factor based on a plurality of probability values determined from the symbol transition information;
         a second factor based on a current count of program-erase cycles; and
         a third factor based on a word line zone value for a word line zone of the flash memory device containing the flash memory cells from which data was read in response to the first host read commands;
      generate an updated reading threshold voltage, to be applied to the control gates of memory cells in the flash memory device while reading symbols from the flash memory device, in accordance with the reading threshold voltage offset and the current value of the reading threshold voltage; and
      in response to one or more second host read commands, different from the one or more first host read commands received from the host device, read data from the flash memory cells in accordance with the one or more second host read commands and the updated reading threshold voltage.

13. The controller of claim 12, wherein the memory controller is configured to obtain symbol transition information by obtaining symbol transition information for a set of reference cells in respective codewords of the data read in response to the one or more first host read commands.

14. The controller of claim 13, wherein the set of reference cells of each respective codeword contains $n \cdot 2^n$ bits of information, where n is the number of bits stored per flash memory cell.

15. The controller of claim 12, wherein the memory controller is configured to obtain symbol transition information by receiving corrected read data from an ECC decoder and corresponding raw data read in response to the one or more first host read commands.

16. The controller of claim 15, wherein the read data is collected during a read patrol operation.

17. The controller of claim 12, wherein the memory controller is configured to determine the reading threshold voltage offset every X program-erase cycles, wherein X is an integer.

18. The controller of claim 12, wherein the memory controller is further configured to determine a plurality of reading threshold voltage offsets, wherein the plurality of reading threshold voltage offsets is equal to $2^n-1$ reading threshold voltage offsets, where n is the number of bits stored per flash memory cell.

19. The controller of claim 12, wherein the first factor is based on a ratio of a first set of probability values determined from a first set of symbol transition information to a second set of a probability values determined from a second set of symbol transition information, wherein the second set of symbol transition information was generated at time T-2 and the first set of symbol transition information is generated at time T-1.

20. The controller of claim 12, wherein the second factor is based on a cumulative count of program-erase cycles for the flash memory device or a predefined portion of the flash memory device.

21. The controller of claim 12, wherein the flash memory device includes a plurality of word line zones.

22. The controller of claim 21, wherein the memory controller is configured to generate an updated reading threshold voltage for each of the plurality of word line zones.

* * * * *